(12) United States Patent
Song et al.

(10) Patent No.: US 11,699,880 B2
(45) Date of Patent: *Jul. 11, 2023

(54) BACKPLANE CONNECTOR

(71) Applicant: Dongguan Luxshare Technologies Co., Ltd, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 250 days.

This patent is subject to a terminal disclaimer.

(21) Appl. No.: 17/334,157

(22) Filed: May 28, 2021

(65) Prior Publication Data

US 2021/0399486 A1    Dec. 23, 2021

(30) Foreign Application Priority Data

Jun. 19, 2020  (CN) .......................... 202010567796.4
Jul. 22, 2020  (CN) .......................... 202021461673.4

(51) Int. Cl.
*H01R 13/648* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/712; H01R 12/716; H01R 12/722; H01R 12/724;
(Continued)

(56) References Cited

U.S. PATENT DOCUMENTS 4,601,527 A   7/1986  Lemke
5,664,968 A   9/1997  Mickievicz
(Continued)

FOREIGN PATENT DOCUMENTS

CN      1244959 A    2/2000
CN      2513252 Y    9/2002
(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of wafers and a spacer for assembling the number of wafers together. Each wafer includes an insulating frame. The insulating frame includes a first protrusion. The spacer includes a body portion. The body portion has a number of slots for holding the first protrusions of the wafers. A periphery of each slot is surrounded by the body portion. Compared with the prior art, the spacer of the present disclosure is provided with a number of slots for holding the first protrusions of the wafers. As a result, the wafers can be easily assembled and fixed as a whole.

10 Claims, 26 Drawing Sheets

(51) Int. Cl.

| | | |
|---|---|---|
| *H01R 13/40* | (2006.01) | |
| *H01R 13/6587* | (2011.01) | |
| *H01R 13/6591* | (2011.01) | |
| *H01R 13/514* | (2006.01) | |
| *H01R 13/518* | (2006.01) | |
| *H01R 12/72* | (2011.01) | |
| *H01R 13/6586* | (2011.01) | |
| *H01R 12/58* | (2011.01) | |
| *H05K 1/11* | (2006.01) | |
| *H01R 13/6588* | (2011.01) | |
| *H01R 13/6583* | (2011.01) | |
| *H01R 13/6585* | (2011.01) | |
| *H01R 13/6582* | (2011.01) | |
| *H01R 43/24* | (2006.01) | |
| *H01R 12/71* | (2011.01) | |
| *H01R 13/20* | (2006.01) | |
| *H01R 13/504* | (2006.01) | |
| *H01R 13/6461* | (2011.01) | |
| *H01R 13/6584* | (2011.01) | |
| *H05K 3/30* | (2006.01) | |
| *H01R 13/02* | (2006.01) | |
| *H05K 3/34* | (2006.01) | |
| *H01R 13/6474* | (2011.01) | |
| *H01R 13/502* | (2006.01) | |
| *H01R 13/46* | (2006.01) | |
| *H01R 13/646* | (2011.01) | |
| *H01R 13/6473* | (2011.01) | |
| *H01R 13/6581* | (2011.01) | |

(52) U.S. Cl.
CPC ........... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
CPC ........................... H01R 12/71; H01R 13/6471; H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115; H05K 2201/09236; H05K 2201/10189; H05K 2201/10371; H05K 2201/1078; H05K 2201/10871
USPC .................................................. 439/607.05
See application file for complete search history.

(56) References Cited

U.S. PATENT DOCUMENTS

| | | |
|---|---|---|
| 9,350,126 B2 | 5/2016 | Little et al. |
| 9,548,570 B2 | 1/2017 | Laurx et al. |
| 11,600,952 B2* | 3/2023 | Song .................. H01R 13/6471 |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |
| 2019/0044284 A1 | 2/2019 | Dunham |
| 2021/0399486 A1* | 12/2021 | Song ..................... H01R 13/514 |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |

(56) References Cited

FOREIGN PATENT DOCUMENTS

| | | |
|---|---|---|
| CN | 109841981 A | 6/2019 |
| CN | 109950721 A | 6/2019 |
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| CN | 111682389 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I545845 B | 8/2016 |
| TW | M537321 U | 2/2017 |
| TW | 201733225 A | 9/2017 |
| TW | I600231 B | 9/2017 |
| TW | 201810825 A | 3/2018 |
| TW | I528659 B | 4/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| TW | 202046584 A | 12/2020 |
| WO | WO 2016/168820 A1 | 10/2016 |
| WO | WO 2017/106266 A1 | 6/2017 |

* cited by examiner

BACKPLANE CONNECTOR

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202021461673.4, filed on Jul. 22, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connectors usually include an insulating housing and a plurality of wafers assembled to the insulating housing. Each wafer includes an insulating frame, a plurality of conductive terminals insert-molded with the insulating frame, and a metal shield mounted to at least one side of the insulating frame. The conductive terminals usually include multiple pairs of differential signal terminals, a first ground terminal located on one side of each pair of differential signal terminals, and a second ground terminal located on the other side of each pair of differential signal terminals. The first ground terminal, the second ground terminal and the metal shield provide shielding for the differential signal terminals in order to reduce signal crosstalk and improve the quality of signal transmission.

However, how to assemble multiple wafers into a whole so as to facilitate assembly and fixation is a technical problem that needs to be solved by those skilled in the art.

SUMMARY

An object of the present disclosure is to provide a backplane connector with a plurality of wafers easily to be assembled.

In order to achieve the above object, the present disclosure adopts the following technical solution: a backplane connector, comprising: a plurality of wafers, each wafer comprising an insulating frame and a plurality of conductive terminals fixed to the insulating frame; and a spacer assembling the plurality of wafers; wherein the insulating frame comprises a first protrusion; and wherein the spacer comprises a body portion, and the body portion defines a plurality of slots each of which is adapted to fix corresponding first protrusion.

Compared with the prior art, the spacer of the present disclosure is provided with a plurality of slots for holding the first protrusions of the wafers. As a result, the wafers can be easily assembled and fixed as a whole.

DETAILED DESCRIPTION

Figure 1:
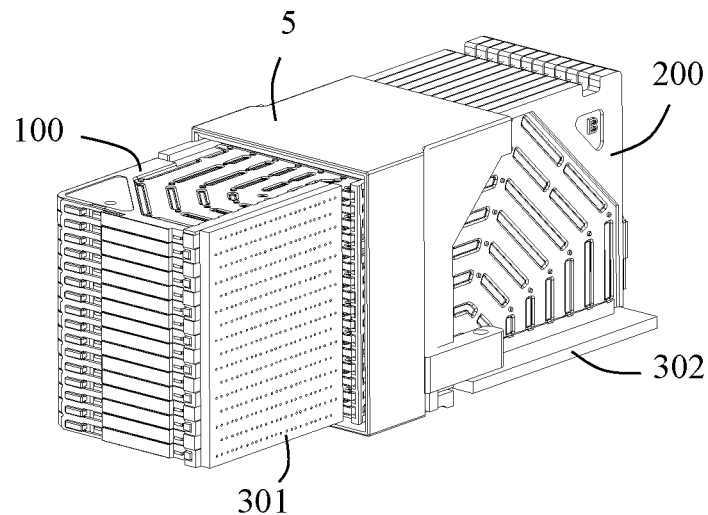
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
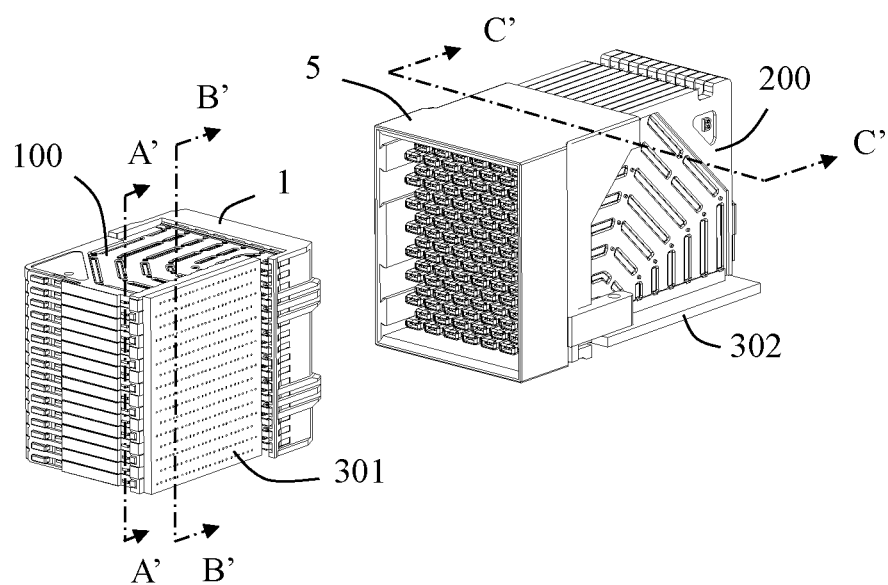
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
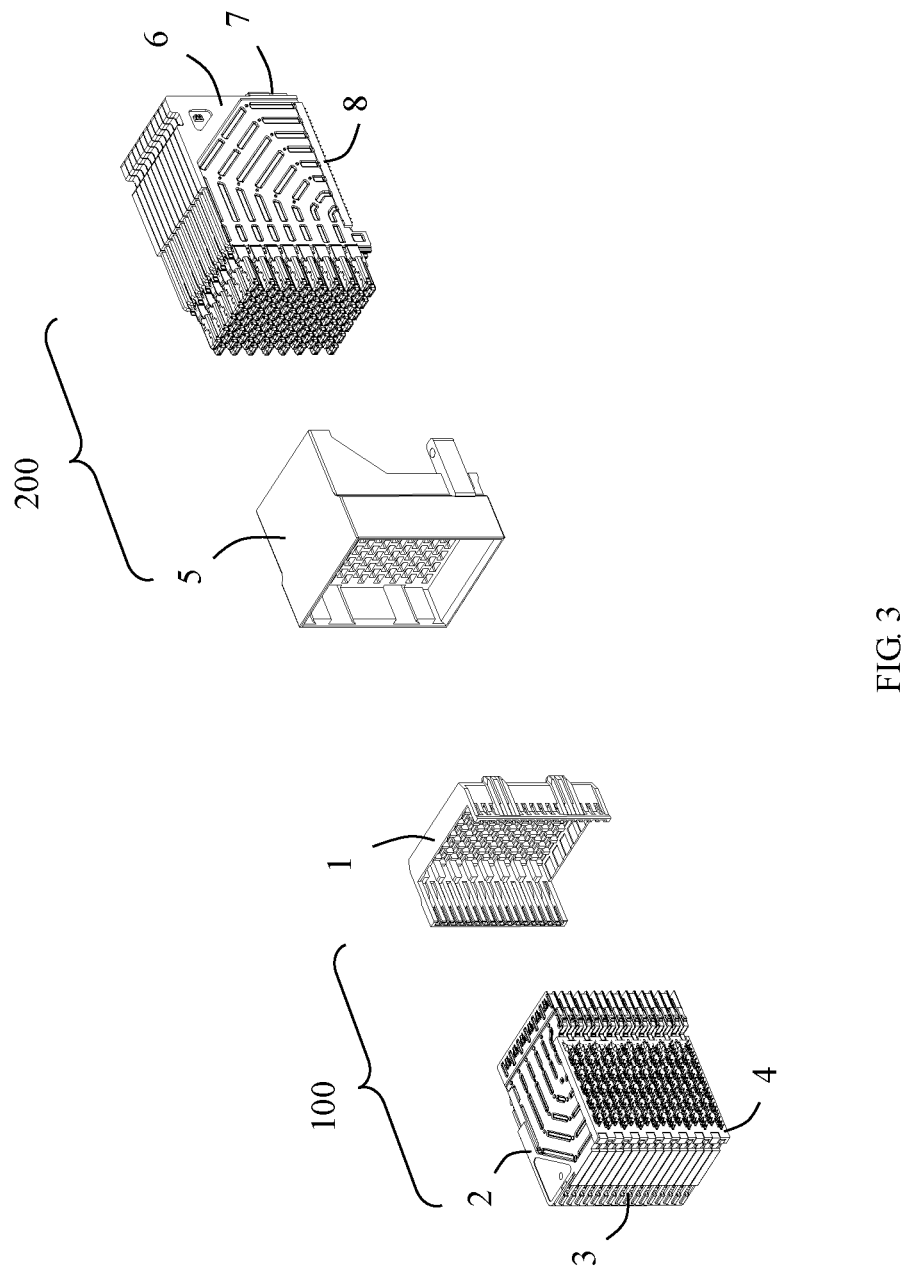
FIG. 3 is a further perspective exploded view of FIG. 2.
Figure 4:
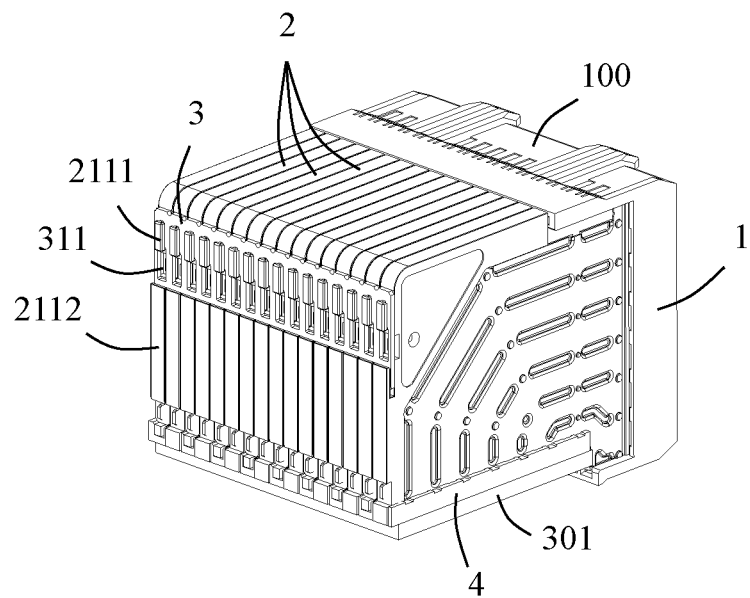
FIG. 4 is a perspective schematic view of a first backplane connector of the present disclosure when it is mounted to a first circuit board.
Figure 5:
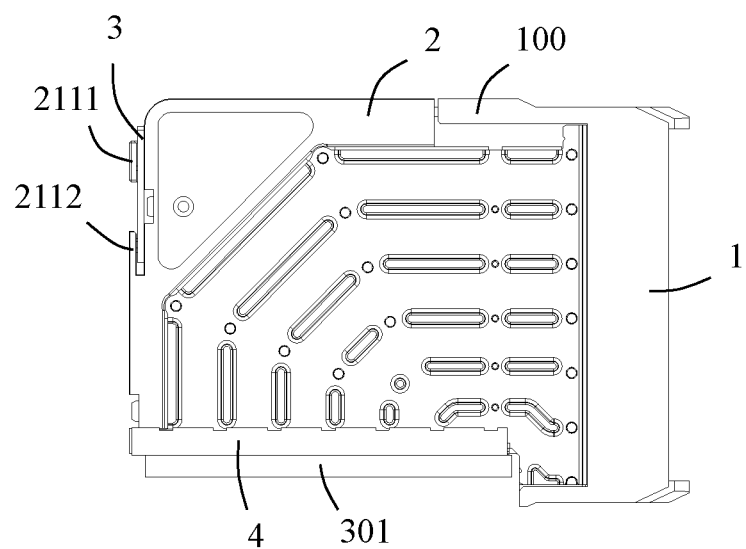
FIG. 5 is a front view of FIG. 4.

Referring to FIGS. 3 and 4, the first backplane connector 100 includes a header 1, a plurality of wafers 2 assembled to the header 1, a spacer 3 fixed at a rear end of the plurality of wafers 2, and a mounting block 4 mounted at a bottom end of the plurality of wafers 2.

Referring to FIGS. 5 to 8, the wafer 2 includes an insulating frame 21, a plurality of conductive terminals 22 fixed to the insulating frame 21, a first metal shield 23 fixed on one side of the insulating frame 21, and a second metal shield 24 fixed on the other side of the insulating frame 21.

Figure 8:
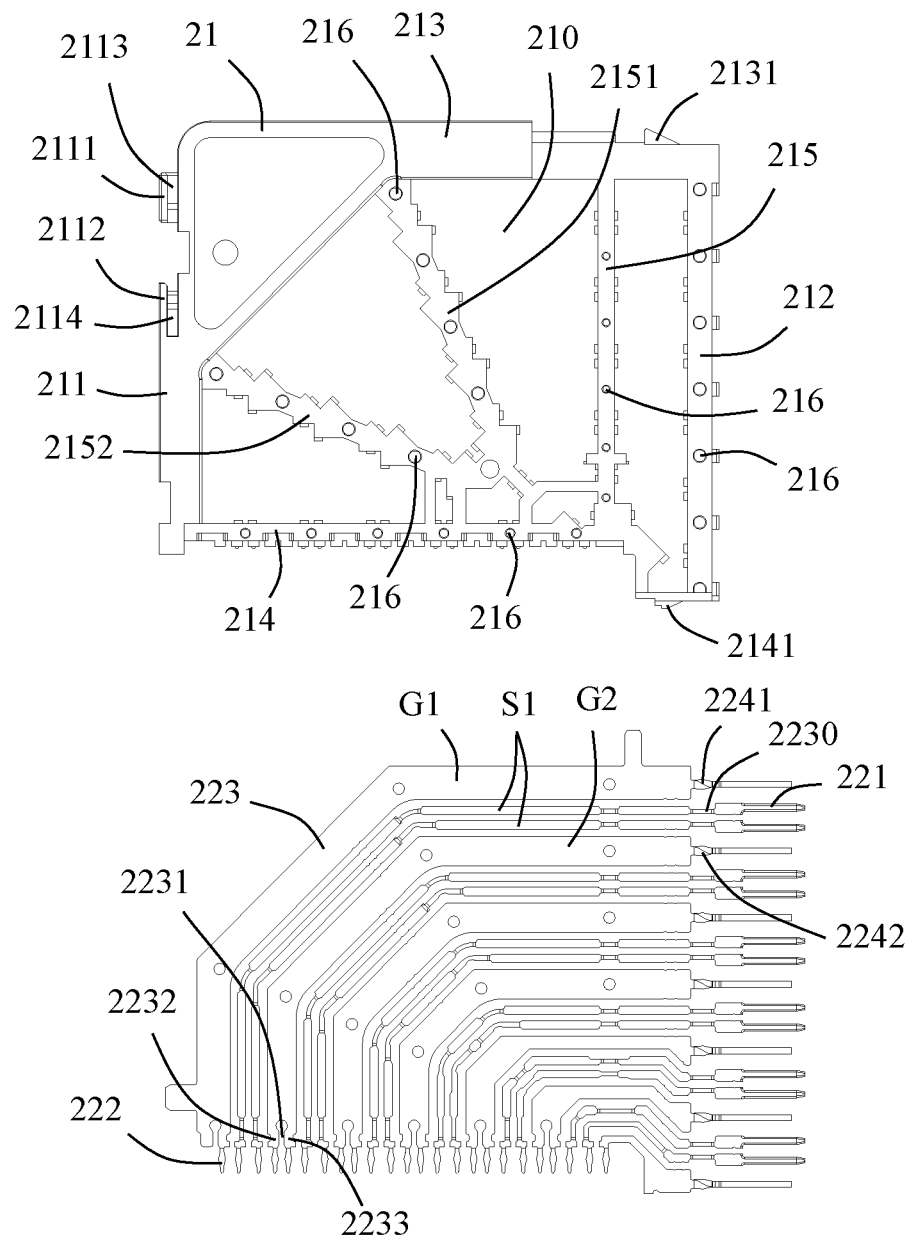
FIG. 8 is a side view of the insulating frame when separated from the conductive terminals.

Referring to FIG. 8, each insulating frame 21 is roughly frame-shaped and includes a rear wall 211, a front wall 212 opposite to the rear wall 211, a top wall 213 connecting one end of the rear wall 211 and one end of the front wall 212, a bottom wall 214 connecting the other end of the rear wall 211 and the other end of the front wall 212, and a plurality of connecting walls 215. The connecting walls 215 are capable of enhancing the structural strength of the frame. The rear wall 211 includes a first protrusion 2111 and a second protrusion 2112 which protrude rearwardly. The first protrusion 2111 and the second protrusion 2112 are spaced apart from each other along the vertical direction. The first protrusion 2111 and the second protrusion 2112 are in alignment with each other along the vertical direction. The first protrusion 2111 includes a first constriction portion 2113, and the second protrusion 2112 includes a second constriction portion 2114. In the illustrated embodiment of the present disclosure, the insulating frame 21 includes a hollow portion 210. The connecting walls 215 include a first connecting wall 2151 connecting the top wall 213 and the bottom wall 214, and a second connecting wall 2152 connecting the rear wall 211 and the bottom wall 214. The first connecting wall 2151 and the second connecting wall 2152 are exposed in the hollow portion 210. The top wall 213 includes a first locking protrusion 2131 for being inserted into the first locking groove 122. The bottom wall 214 includes a second locking protrusion 2141 for being inserted into the second locking groove 132.

Figure 6:
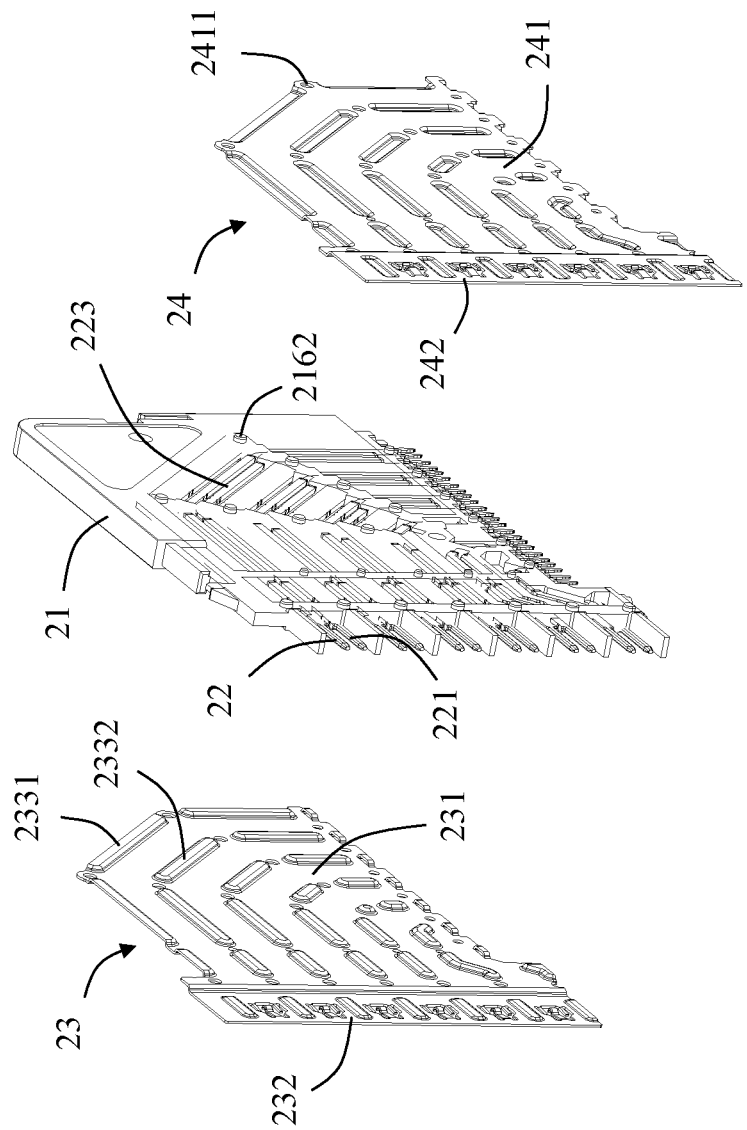
FIG. 6 is a partial perspective exploded view of a wafer of the first backplane connector.
Figure 7:
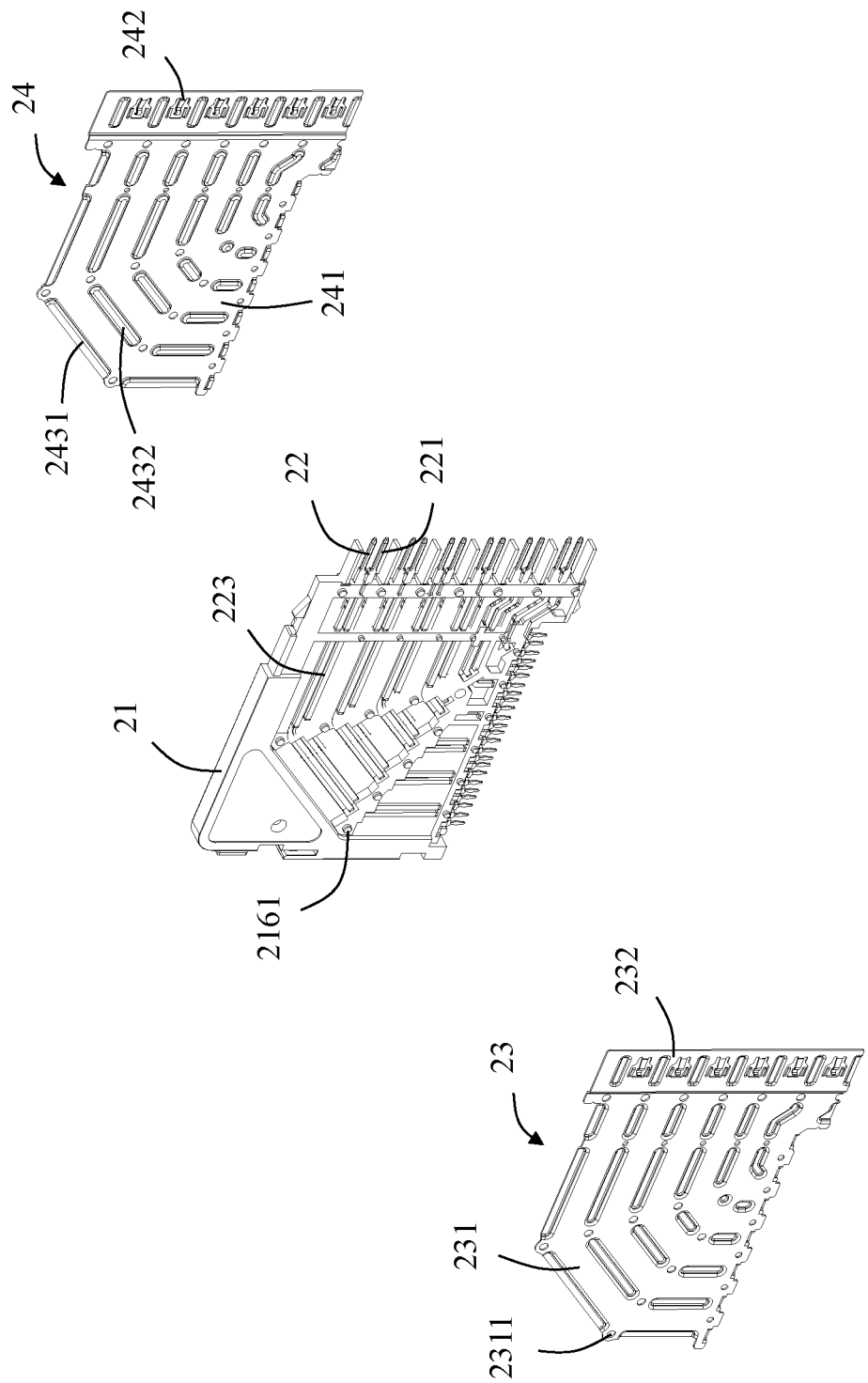
FIG. 7 is a partially exploded perspective view of FIG. 6 from another angle.

Referring to FIGS. 6 to 8, the insulating frame 21 further includes a plurality of posts 216 for fixing the first metal shield 23 and the second metal shield 24. In the illustrated embodiment of the present disclosure, the posts 216 are disposed on the bottom wall 214, the first connecting wall 2151, the second connecting wall 2152 and the front wall 212. The first metal shield 23 and the second metal shield 24 are located on opposite sides of the insulating frame 21, respectively. The posts 216 include a plurality of first posts 2161 and a plurality of second posts 2162. The first posts 2161 and the second posts 2162 are located on opposite sides of the insulating frame 21, respectively, so as to be fixed and positioned with the first metal shield 23 and the second metal shield 24.

Referring to FIG. 8, each conductive terminal 22 includes a contact portion 221, a tail portion 222 and a connection portion 223 connecting the contact portion 221 and the tail portion 222. Some of the contact portions 221 are used to electrically connect with the second backplane connector 200. The tail portions 222 are used for being mounted to the first circuit board 301. In the illustrated embodiment of the present disclosure, the contact portion 221 is substantially perpendicular to the tail portion 222. The connection portion 223 is of a curved configuration.

Each group of conductive terminals 22 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 22 are arranged in a manner of G1-S1-S1-G2, which is beneficial to improve the quality of signal transmission. The differential signal terminals are narrow-side coupling or wide-side coupling. A width of the first ground terminal G1 and a width the second ground terminal G2 are greater than a width of each signal terminal S1 which is located between the first ground terminal G1 and the second ground terminal G2. Therefore, it is beneficial to increase the shielding area and improve the shielding effect.

In the illustrated embodiment of the present disclosure, the connection portions 223 of the conductive terminals 22 are partially insert-molded with the insulating frame 21. Each connection portion 223 of the signal terminal S1 has a narrowed portion 2230 insert-molded with the insulating frame 21 so as to adjust the impedance of the signal terminal S1 for achieving impedance matching. In the illustrated embodiment of the present disclosure, the contact portion 221 of the signal terminal S1 is substantially needle-shaped. The contact portion 221 of the first ground terminal G1 and the contact portion 221 of the second ground terminal G2 are substantially rectangular-shaped. The contact portion 221 of the signal terminal S1 and the connection portion 223 of the conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connecting its contact portion 221 and its tail portion 222, so that the contact portion 221 of the first ground terminal G1 is located in a second plane (for example, a vertical plane) perpendicular to the first plane. The second ground terminal G2 includes a second torsion portion 2242 connecting its contact portion 221 and its tail portion 222, so that the contact portion 221 of the second ground terminal G2 is also located in the second plane (for example, the vertical plane) perpendicular to the first plane. The contact portion 221 of the first ground terminal G1 and the contact portion 221 of the second ground terminal G2 are parallel to each other. Each connection portion 223 of the first ground terminals G1 and the second ground terminals G2 further includes a slot 2231 adjacent to its corresponding tail portion 222. The slot 2231 extend through a bottom edge of the connection portion 223, so that the connection portions 223 is divided into a first end portion 2232 and a second end portion 2233.

Figure 9:
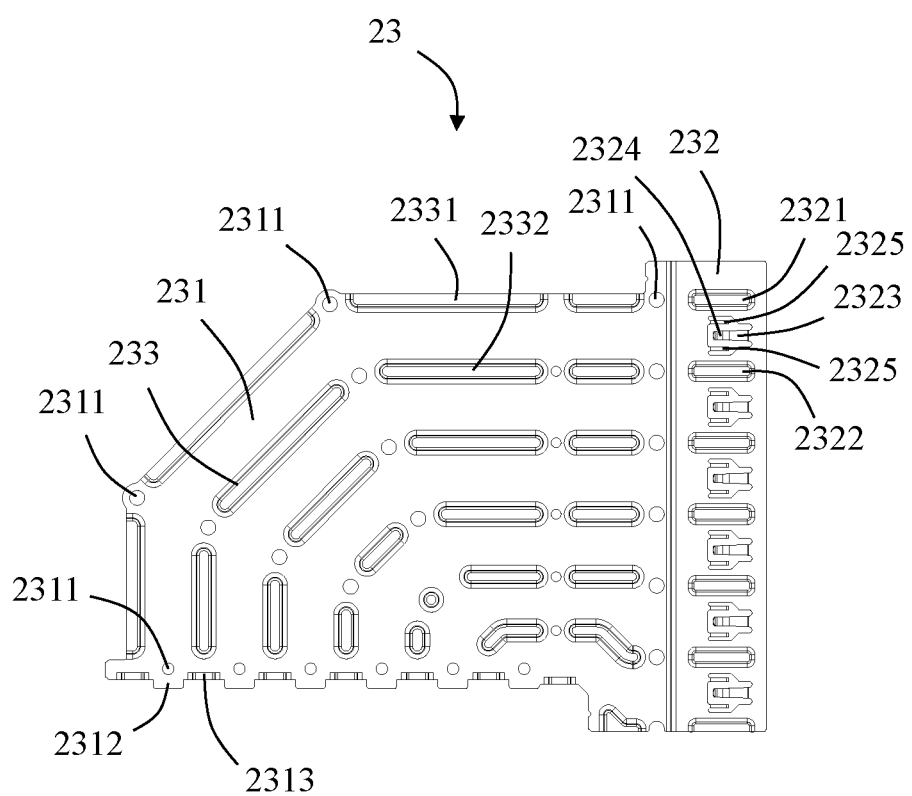
FIG. 9 is a side view of the first metal shield of the first backplane connector.

In the illustrated embodiment of the present disclosure, the first metal shield 23 and the second metal shield 24 are symmetrically disposed on opposite sides of the insulating frame 21. Referring to FIG. 9, the first metal shield 23 includes a first main body portion 231 and a first extension portion 232 extending from the first main body portion 231. The first main body portion 231 is located on one side of the connection portions 223 of the conductive terminals 22. The first extension portion 232 is located on one side of the contact portions 221 of the conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161. The first posts 2161 are fixed and positioned in the first mounting holes 2311 by soldering, thereby the fixing and positioning of the first metal shield 23 and the insulating frame 21 are realized. The first main body portion 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the connection portion 223 of the first ground terminal G1. The second ribs 2332 corresponding to the second ground terminal G2 are disposed along an extending direction of the connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the connection portion 223 of the first ground terminal G1 and the extending direction of the connection portion 223 of the second ground terminal G2, respectively, so as to achieve multi-position contact. In order to improve the reliability of the contact between the first metal shield 23 and the first ground terminals G1 and the second ground terminals G2. In the illustrated embodiment of the present disclosure, referring to FIG. 12, a wall thickness of the first rib 2331, a wall thickness of the second rib 2332, and a wall thickness of a portion of the first main body portion 231 located between the first rib 2331 and the second rib 2332 are the same.

The first extension portion 232 includes a plurality of first bulges 2321 protruding toward the corresponding contact portions 221 of the first ground terminals G1, a plurality of second bulges 2322 protruding toward the corresponding contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent wafer 2 so as to improve the shielding effect. In the illustrated embodiment of the present disclosure, referring to FIG. 14, a wall thickness of the first bulge 2321, a wall thickness of the second bulge 2322 and a wall thickness of a portion of the first extension portion 232 located between the first bulge 2321 and the second bulge 2322 are the same.

In addition, the first main body portion 231 further includes a plurality of first protruding pieces 2312 extending downwardly from a bottom edge thereof and a plurality of connecting pieces 2313 each of which is located between two adjacent first protruding pieces 2312. By providing the first protruding pieces 2312, the shielding length can be extended, and the shielding effect of the signal terminals S1 can be improved. In the illustrated embodiment of the present disclosure, the connecting pieces 2313 are stamped from the first main body portion 231. Each connecting piece 2313 straddles the corresponding slot 2231 to connect one side of the first end portion 2232 and the second end portion 2233 of the same first ground terminal G1, thereby improving the shielding effect. At the same time, each connecting piece 2313 can also connect one side of the first end portion 2232 and the second end portion 2233 of the same second ground terminal G2, thereby improving the shielding effect.

Figure 10:
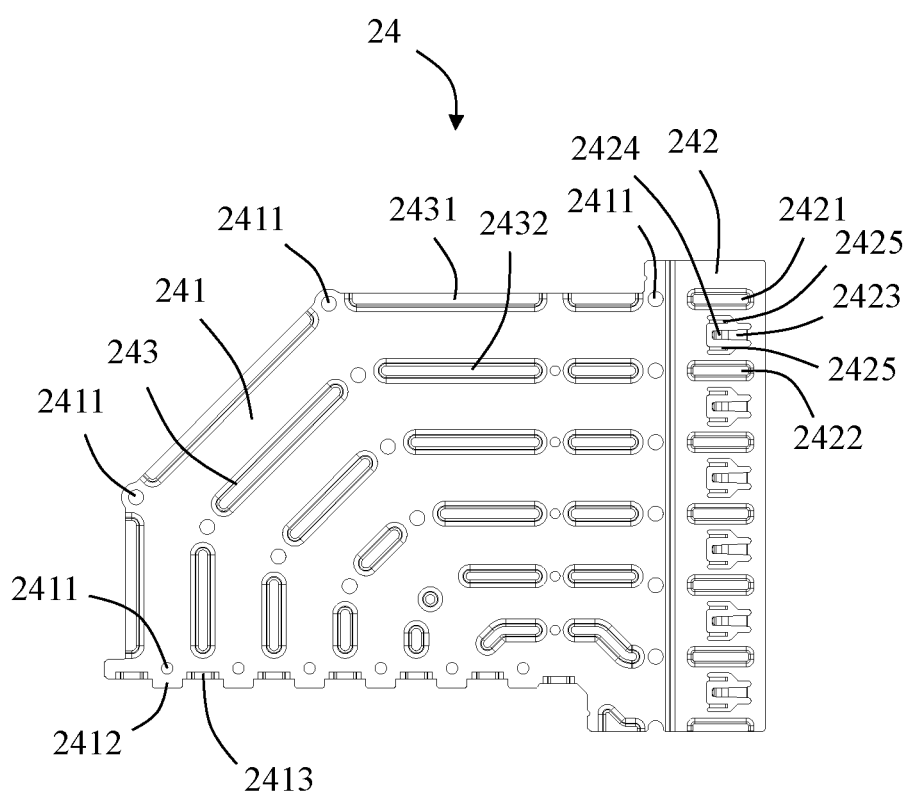
FIG. 10 is a side view of the second metal shield of the first backplane connector.

Similarly, referring to FIG. 10, the second metal shield 24 includes a second main body portion 241 and a second extension portion 242 extending from the second main body portion 241. The second main body portion 241 is located on the other side of the connection portions 223 of the conductive terminals 22. The second extension portion 242 is located on the other side of the contact portions 221 of the conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162. The second posts 2162 are fixed and positioned in the second mounting holes 2411 by soldering, so as to realize the fixing and positioning of the second metal shield 24 and the insulating frame 21. The second main body portion 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the connection portion 223 of the first ground terminal G1. The fourth ribs 2432 are disposed along the extending direction of the connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the connection portion 223 of the first ground terminal G1 and the extending direction of the connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body portion 241 located between the third rib 2431 and the fourth rib 2432 are the same. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering.

The second extension portion 242 includes a plurality of third bulges 2421 protruding toward the contact portions 221 of the first ground terminals G1, a plurality of fourth bulges 2422 protruding toward the contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent wafer 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same.

In addition, the second main body portion 241 further includes a plurality of second protruding pieces 2412 extending downwardly from a bottom edge thereof, and a plurality of connecting pieces 2413 each of which is located between two adjacent second protruding pieces 2412. By providing the second protruding pieces 2412, the shielding length can be extended, and the shielding effect on the signal terminals S1 can be improved. In the illustrated embodiment of the present disclosure, the connecting pieces 2413 are stamped from the second main body portion 241, and the connecting piece 2413 straddles the corresponding slot 2231 so as to connect the other side of the first end portion 2232 and the second end portion 2233 of the same first ground terminal G1 so as to improve the shielding effect. At the same time, the connecting piece 2413 can also connect the other side of the first end portion 2232 and the second end portion 2233 of the same second ground terminal G2 so as to improve the shielding effect.

Figure 12:
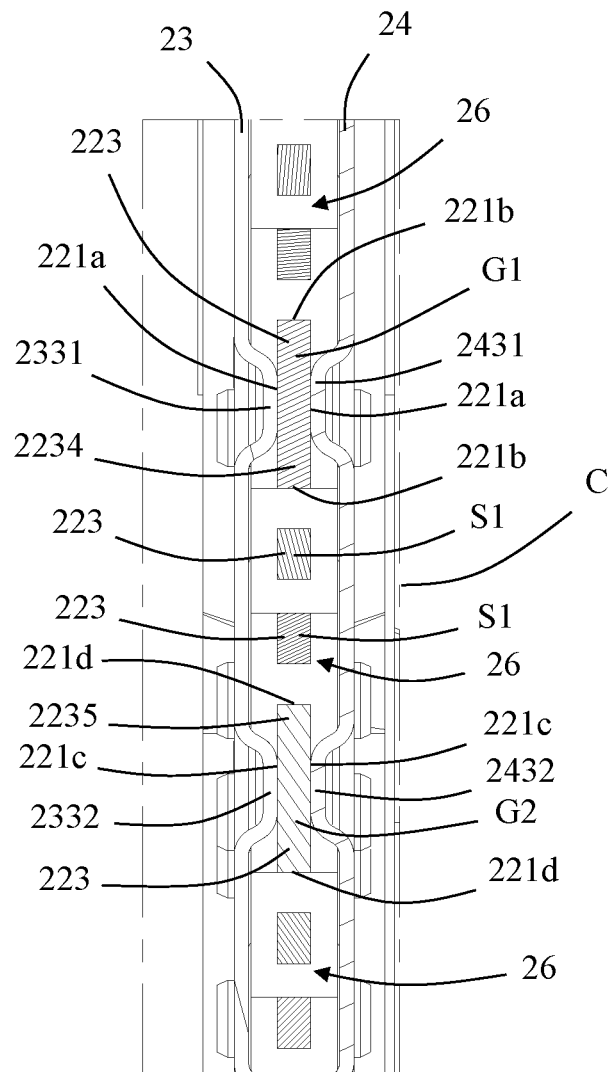
FIG. 12 is a partial enlarged view of a frame part C in FIG. 11.
Figure 14:
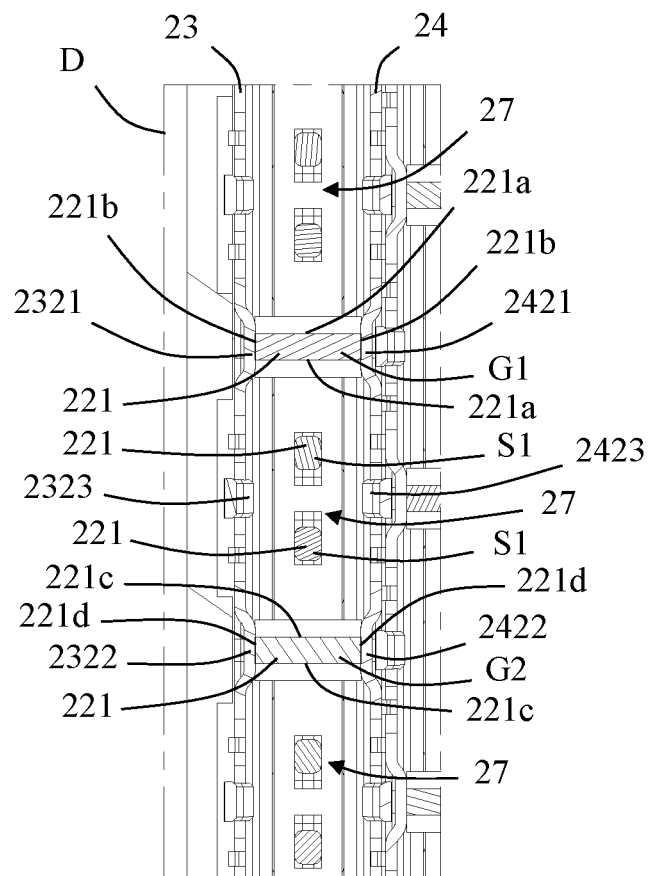
FIG. 14 is a partial enlarged view of a frame part D in FIG. 13.

Referring to FIGS. 12 and 14, in the illustrated embodiment of the present disclosure, the contact portion 221 and the connection portion 223 of the first ground terminal G1 have a first wide surface 221a and a first narrow surface 221b perpendicular to the first wide surface 221a. The contact portion 221 and the connection portion 223 of the second ground terminal G2 have a second wide surface 221c and a second narrow surface 221d perpendicular to the second wide surface 221c. The connection portions 223 of each pair of differential signal terminals are located between the first narrow surface 221b of the first ground terminal G1 and the second narrow surface 221d of the second ground terminal G2 which are located on opposite sides of the connection portions 223 of each pair of differential signal terminals. The contact portions 221 of each pair of differential signal terminals are located between the first wide surface 221a of the first ground terminal G1 and the second wide surface 221c of the second ground terminal G2 which are located on opposite sides of the contact portions 221 of each pair of differential signal terminals. In the illustrated embodiment of the present disclosure, a width of the first wide surface 221a and a width of the second wide surface 221c are greater than a width of each contact portion 221 of the signal terminals S1, thereby better shielding can be provided for the contact portions 221 of the signal terminals S1.

Figure 11:
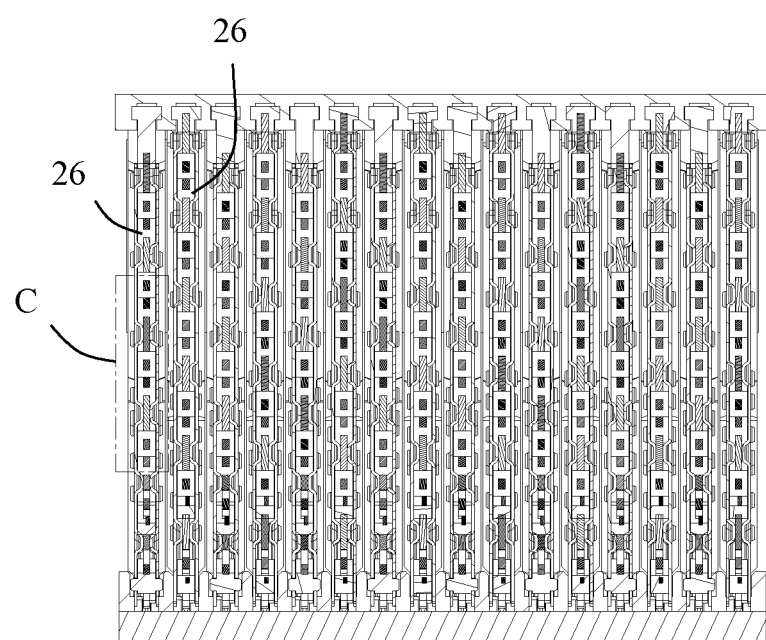
FIG. 11 is a schematic cross-sectional view taken along the line A'-A' in FIG. 2.

Referring to FIGS. 11 and 12, along a length of the connection portion 223 of the conductive terminal 22, the first rib 2331 of the first metal shield 23 and the third rib 2431 of the second metal shield 24 respectively contact two opposite sides of the connection portion 223 of the first ground terminal G1, and the second rib 2332 of the first metal shield 23 and the fourth rib 2432 of the second metal shield 24 respectively contact two opposite sides of the connection portion 223 of the second ground terminal G2, thereby forming a shielding cavity 26 surrounding the outer periphery of the connection portions 223 of each pair of differential signal terminals. In the illustrated embodiment of the present disclosure, the first rib 2331 and the third rib 2431 respectively contact the first wide surface 221a of the connection portion 223 of the first ground terminal G1. The second rib 2332 and the fourth rib 2432 respectively contact the second wide surface 221c of the connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The connection portion 223 of the first ground terminal G1 includes a first tab portion 2234 protruding into the shielding cavity 26. The connection portion 223 of the second ground terminal G2 includes a second tab portion 2235 protruding into the shielding cavity 26. The connection portions 223 of the differential signal terminals are located between the first tab portion 2234 and the second tab portion 2235. In the illustrated embodiment of the present disclosure, there are a plurality of the shielding cavities 26 which are disposed along an arrangement direction of each group of the conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Referring to FIG. 14, in the length of the contact portion 221 of the conductive terminal 22, the first bulge 2321 of the first metal shield 23 and the third bulge 2421 of the second metal shield 24 respectively contact two opposite side surfaces of the contact portion 221 of the first ground terminal G1, and the second bulge 2322 of the first metal shield 23 and the fourth bulge 2422 of the second metal shield 24 respectively contact two opposite side surfaces of the contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the contact portion 221 of the first ground terminal G1. The second bulge 2322 of the first metal shield 23 and the fourth bulge 2422 of the second metal shield 24 respectively contact the second narrow surfaces 221d of the contact portion 221 of the second ground terminal G2. The first extension portion 232, the second extension portion 242, the first ground terminal G1 and the second ground terminal G2 jointly form a shielding space 27 for accommodating the corresponding contact portions 221 of the differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the conductive terminals 22. Two adjacent shielding spaces 27 share a single first ground terminal G1 or a single second ground terminal G2. One first wide surface 221a of the contact portion 221 of the shared first ground terminal G1 is exposed to the shielding space 27, and the other first wide surface 221a of the contact portion 221 of the shared first ground terminal G1 is exposed to an adjacent shielding space 27. Similarly, a first wide surface 221c of the contact portion 221 of the shared second ground terminal G2 is exposed to the adjacent shielding space 27, and the other wide surface 221c of the contact portion 221 of the shared second ground terminal G2 is exposed to another adjacent shielding space 27.

Figure 13:
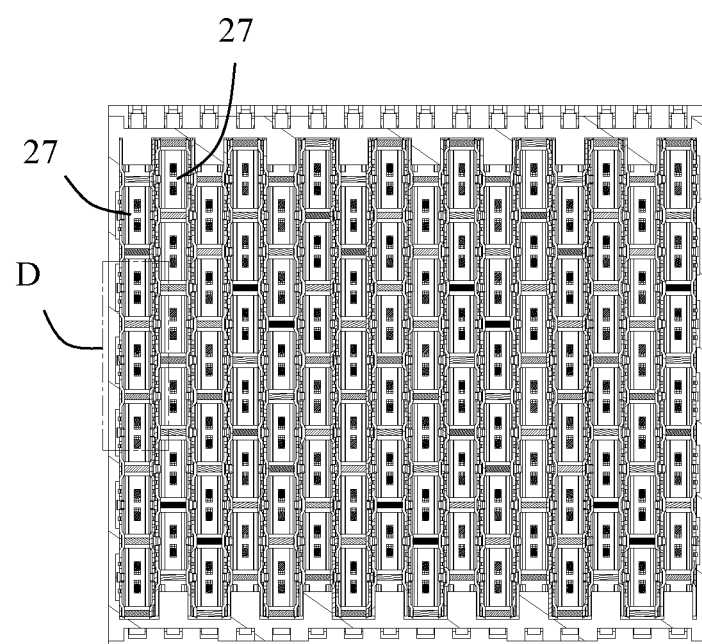
FIG. 13 is a schematic cross-sectional view taken along line B'-B' in FIG. 2.

In the illustrated embodiment of the present disclosure, there are multiple wafers 2 of the first backplane connector 100, and the terminal arrangement of two adjacent wafers 2 are staggered. Correspondingly, the shielding cavities 26 at the same position of two adjacent wafers 2 are staggered (referring to FIG. 13), and the shielding spaces 27 at the same position of two adjacent wafers 2 are staggered (referring to FIG. 15).

Figure 15:
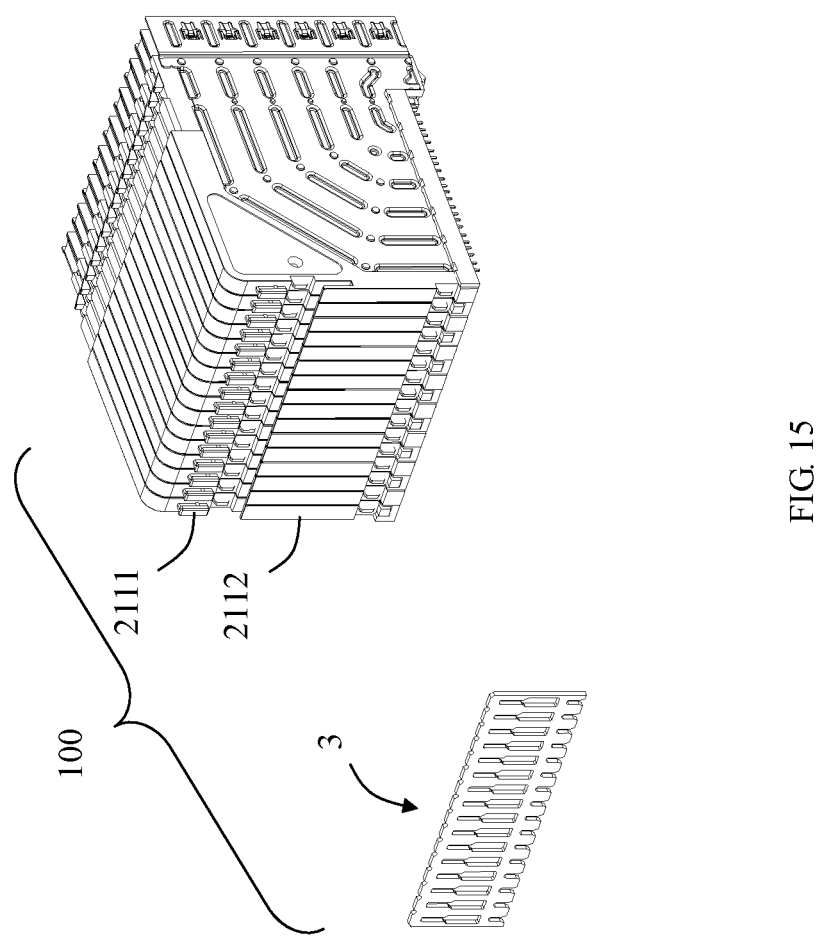
FIG. 15 is a partial perspective exploded view of the second backplane connector, in which a spacer is separated.
Figure 16:
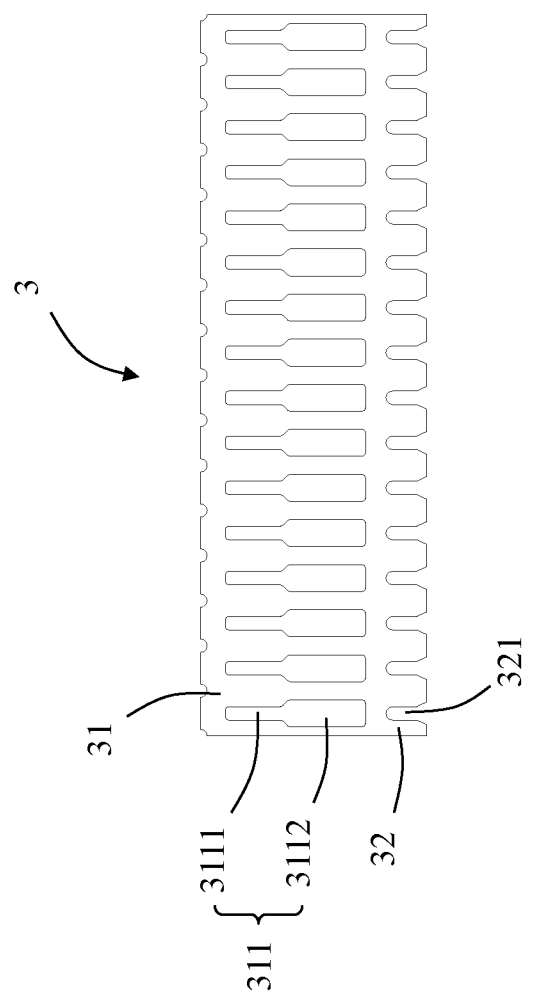
FIG. 16 is a top view of the spacer in FIG. 15.

Referring to FIGS. 15 and 16, in the illustrated embodiment of the present disclosure, the spacer 3 is made of metal material or insulating material. The spacer 3 includes a body portion 31 and a protruding piece 32 extending from the body portion 31. The body portion 31 includes a plurality of slots 311 corresponding to the first protrusions 2111. The protruding piece 32 includes a plurality of slits 321 corresponding to the second protrusions 2112, so that the protruding piece 32 is roughly comb-shaped. Each slot 311 is a closed slot, which means the circumference of the slot 311 is surrounded by the body portion 31. Each slit 321 is a non-closed slit, which means one end of the slit 321 is opened. The slit 321 is in alignment with the corresponding slot 321 along the vertical direction. Each slot 311 includes a first slot 3111 and a second slot 3112 which has a width larger than that of the first slot 3111. The first slot 3111 is located above the second slot 3112 and communicates with the corresponding second slot 3112. The slit 321 is located below the corresponding second slot 3112.

When assembling the spacer 3 to the plurality of wafers 2, firstly, the second slots 3112 of the spacer 3 are corresponding to the first protrusions 2111 along the extending direction of the contact portions 221, and make the first protrusions 2111 pass through the second slots 3112. Then, the spacer 3 is moved downwardly along the extending direction of the tail portions 222, so that the first constriction portions 2113 are tightly clamped in the corresponding first slots 3111, thereby the wafers 2 can be combined as a whole. This can prevent looseness and prevent the wafers 2 from being separated from the spacer 3 along the extending direction of the contact portions 221. At the same time, the second constriction portions 2114 of the second protrusions 2112 are tightly clamped in the slits 321 so to achieve double fixation and improve reliability.

Referring to FIG. 3, the second backplane connector 200 includes a header 5, a plurality of wafers 6 assembled to the header 5, a spacer 7 holding on one side of the plurality of wafers 6, and a mounting block 8 holding the other side of the plurality of wafers 6.

Figure 19:
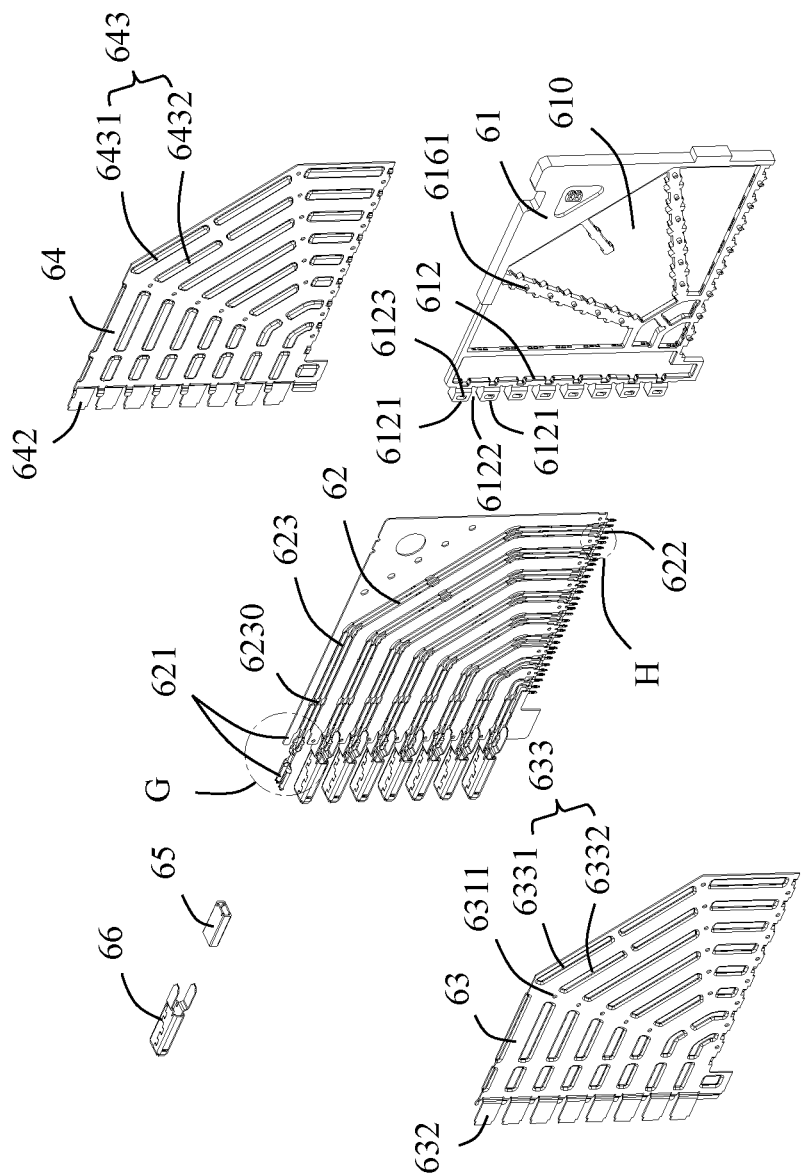
FIG. 19 is a partially exploded perspective view of a wafer of the second backplane connector.
Figure 23:
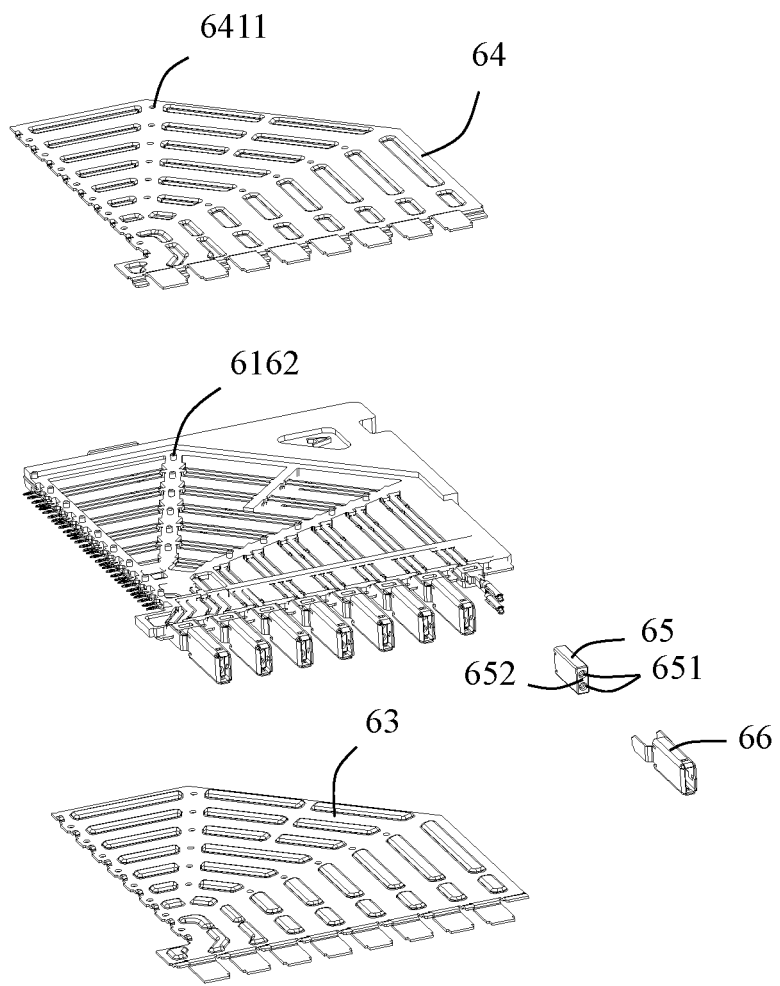
FIG. 23 is a partially exploded perspective view of FIG. 19 from another angle.

Referring to FIGS. 19 and 23, each wafer 6 includes an insulating frame 61, a plurality of conductive terminals 62 insert-molded with the insulating frame 61, a first metal shield 63 fixed on one side of the insulating frame 61, and a second metal shield 64 fixed on the other side of the insulating frame 61.

Figure 26:
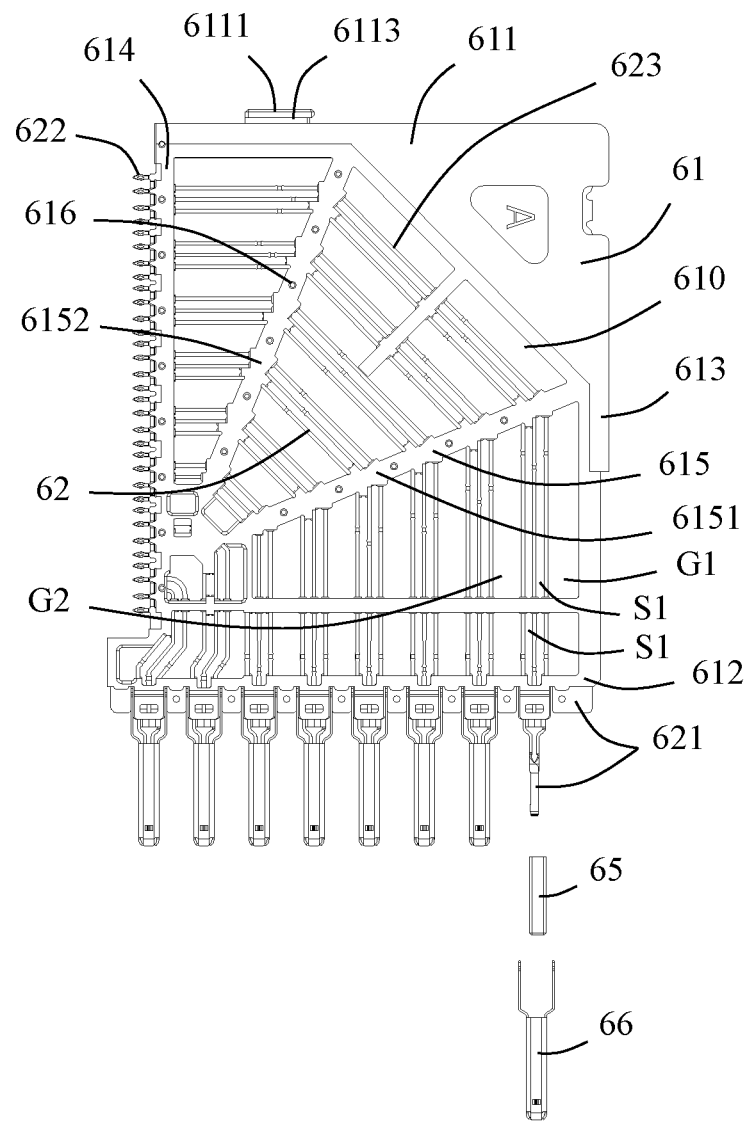
FIG. 26 is a plan view of a wafer of the second backplane connector with an insulating block and a metal shell separated therefrom.

Referring to FIG. 26, the insulating frame 61 is roughly frame-shaped. The insulating frame 61 includes a rear wall 611, a front wall 612 opposite to the rear wall 611, a top wall 613 connecting one end of the rear wall 611 and one end of the front wall 612, a bottom wall 614 connecting the other end of the rear wall 611 and the other end of the front wall 612, and a plurality of connecting walls 615. The connecting walls 615 can enhance the structural strength of the frame. The rear wall 611 includes a first protrusion 6111. The first protrusion 6111 includes a first constriction portion 6113. In the illustrated embodiment of the present disclosure, the insulating frame 61 includes a hollow portion 610. The connecting walls 615 include a first connecting wall 6151 connecting the top wall 613 and the bottom wall 614, and a second connecting wall 6152 connecting the rear wall 611 and the bottom wall 614. The first connecting wall 6151 and the second connecting wall 6152 are exposed in the hollow portion 610.

Referring to FIG. 19, the front wall 612 includes a plurality of protruding blocks 6121 disposed at intervals and a groove 6122 located between two adjacent protruding blocks 6121. The protruding block 6121 includes an opening 6123 to partially expose corresponding conductive terminal 62 in order to adjust the impedance.

The insulating frame 61 further includes a plurality of posts 616 for fixing and positioning the first metal shield 63 and the second metal shield 64. In the illustrated embodiment of the present disclosure, the posts 616 are disposed on the bottom wall 614, the first connecting wall 6151 and the second connecting wall 6152. The first metal shield 63 and the second metal shield 64 are located on two sides of the insulating frame 61, respectively. The posts 616 include a plurality of first posts 6161 and a plurality of second posts 6162. The first posts 6161 and the second posts 6162 are located on opposite sides of the insulating frame 61 so to be fixed to the first metal shield 63 and the second metal shield 64, respectively.

Each conductive terminals 62 includes a contact portion 621, tail portion 622, and a connection portion 623 connecting the contact portion 621 and the tail portion 622. Some of the contact portions 621 are used to electrically connect with the first backplane connector 100. The tail portions 622 are used to be mounted to the second circuit board 302. In the illustrated embodiment of the present disclosure, the contact portion 621 is substantially perpendicular to the tail portion 622. The connection portion 623 is of a curved configuration.

Each group of conductive terminals 62 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 62 are disposed in a manner of G1-S1-S1-G2, which is beneficial to improve the quality of signal transmission. The differential signal terminals are narrow-side coupling or wide-side coupling. A width of the first ground terminal G1 and a width of the second ground terminal G2 are greater than a width of each signal terminal S1 therebetween, which is beneficial to increase the shielding area and improve the shielding effect.

Figure 21:
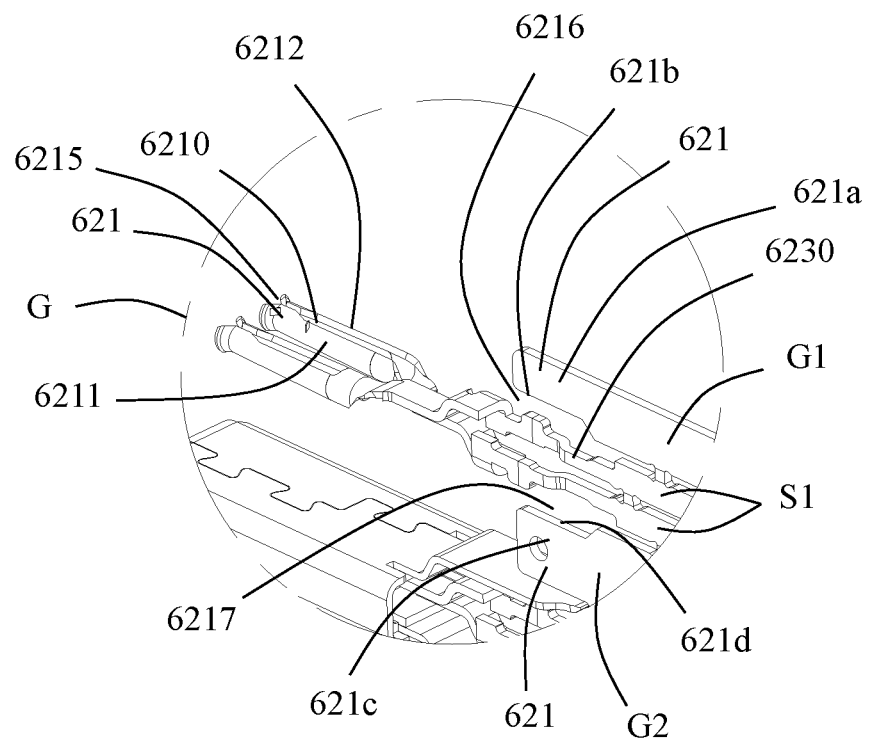
FIG. 21 is a partial enlarged view of a circled part G in FIG. 19.

In the illustrated embodiment of the present disclosure, the connection portions 623 of the conductive terminals 62 are partially insert-molded with the insulating frame 61. The connection portion 623 of the signal terminal S1 includes a narrowed portion 6230 insert-molded with the insulating frame 61 for adjusting the impedance of the signal terminal S1 in order to achieve impedance matching. Referring to FIG. 21, in the illustrated embodiment of the present disclosure, each contact portion 621 of the signal terminal S1 has a two-half structure, which includes a first contact section 6211, a second contact section 6212, and a slot 6210 located between the first contact section 6211 and the second contact section 6212. When the needle-shaped contact portion 221 of the signal terminal S1 of the first backplane connector 100 is inserted between the first contact section 6211 and the second contact section 6212, the first contact section 6211 and the second contact section 6212 can be elastically deformed in order to improve the contact reliability. The first contact section 6211 includes a first arc-shaped surface, and the second contact section 6212 includes a second arc-shaped surface. The first arc-shaped surface and the second arc-shaped surface are disposed opposite to each other so as to jointly form a mating hole 6215 for receiving the contact portion 221 of the signal terminal S1 of the first backplane connector 100. The two signal terminals S1 constituting a pair of differential signal terminals, their connection portions 623 are disposed in a first direction (for example, a vertical direction), and their contact portions 621 are disposed in a direction (for example, a left-right direction) perpendicular to the first direction.

Figure 22:
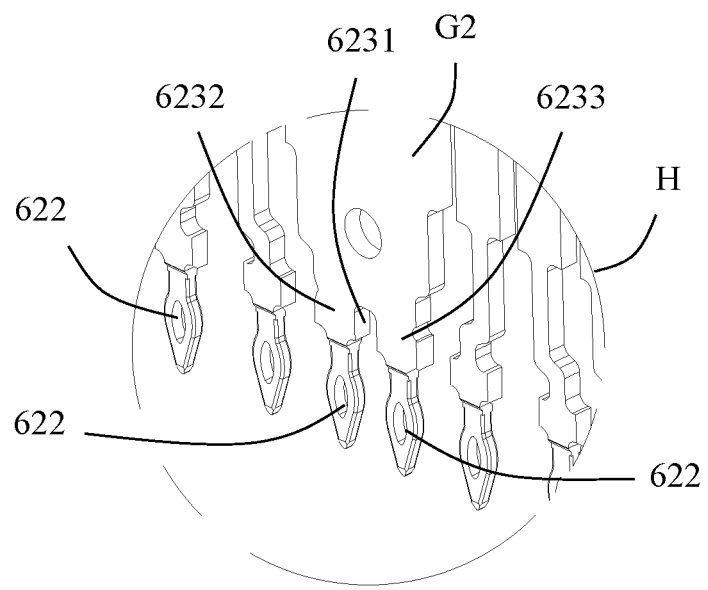
FIG. 22 is a partial enlarged view of a circled part H in FIG. 19.

Each contact portion 621 of the first ground terminal G1 and the second ground terminal G2 is substantially flat. The contact portion 621 of the first ground terminal G1, the contact portion 621 of the second ground terminal G2, and the connection portions 623 of the conductive terminals 62 are all coplanar. As shown in FIG. 22, each connection portion 623 of the first ground terminal G1 and the second ground terminal G2 further includes a slot 6231 adjacent to its corresponding the tail portion 622. The slot 6231 extends through a bottom edge of the connection portion 623, so that the connection portion 623 is divided into a first end portion 6232 and a second end portion 6233. Each of the first end portion 6232 and the second end portion 6233 is connected with one tail portion 622. The contact portion 621 of the first ground terminal G1 and the contact portion 621 of the second ground terminal G2 both extend into the corresponding grooves 6122 to facilitate contact with the first metal shield 63 and the second metal shield 64. The contact portions 621 of the signal terminals S1 extend beyond the protruding block 6121.

In the illustrated embodiment of the present disclosure, the contact portion 621 and the connection portion 623 of the first ground terminal G1 both include a first wide surface 621a and a first narrow surface 621b perpendicular to the first wide surface 621a. The contact portion 621 and the connection portion 623 of the second ground terminal G2 both include a second wide surface 621c and a second narrow surface 621d perpendicular to the second wide surface 621c. The connection portions 623 of each pair of differential signal terminals are located between the first narrow surface 621b of the first ground terminal G1 and the second narrow surface 621d of the second ground terminal G2 which are located on opposite sides of the connection portions 623 of each pair of differential signal terminals.

Figure 17:
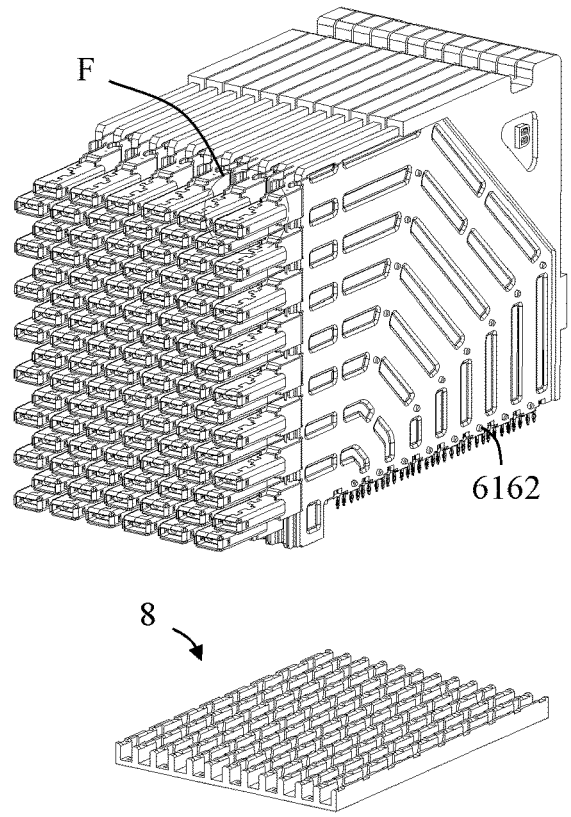
FIG. 17 is a partial perspective exploded view of the second backplane connector, in which a mounting block is separated.
Figure 18:
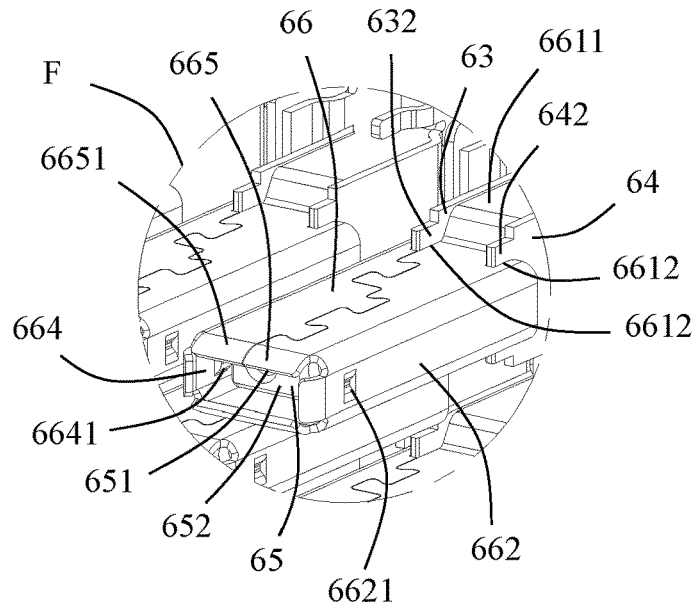
FIG. 18 is a partial enlarged view of a circled part F in FIG. 17.
Figure 20:
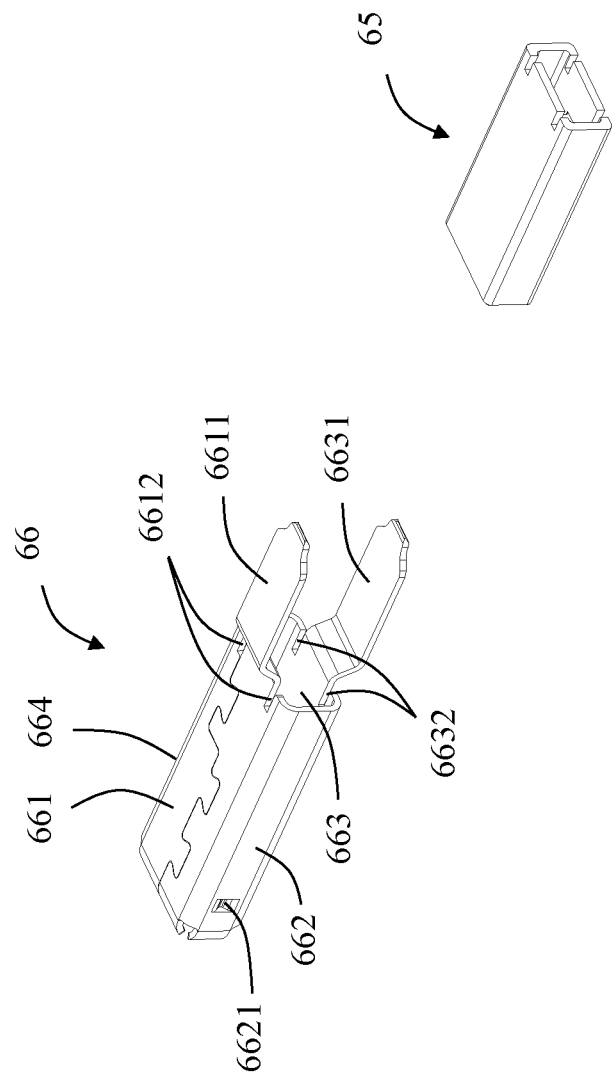
FIG. 20 is a perspective exploded view of an insulating block and a metal shell.

Referring to FIGS. 17, 18, and 20, each group of wafers 6 further includes an insulating block 65 sleeved on the contact portions 621, and a metal shell 66 sleeved on the insulating block 65. Each insulating block 65 includes two through holes 651 into which the contact portions 621 of the signal terminals S1 are inserted, and a mating surface 652 at an end thereof. In the illustrated embodiment of the present disclosure, the insulating block 65 is substantially cuboid shaped. Correspondingly, the metal shell 66 is substantially cuboid shaped. In an embodiment of the present disclosure, the insulating block 65 is fixed in the metal shell 66, for example, by assembling.

Referring to FIG. 20, the metal shell 66 includes a first side wall 661, a second side wall 662, a third side wall 663 and a fourth side wall 664. The first side wall 661 is opposite to the third side wall 663. The second side wall 662 is opposite to the fourth side wall 664. An area of the first side wall 661 and the third side wall 663 is larger than an area of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the metal shell 66, so that outer surfaces 6651 of the deflection portions 665 can guide the wafer 6 to be assembled to the header 5, and even guide the metal shell 66 to be inserted into the shielding space 27 of the first backplane connector 100. In addition, in order to better restrict the insulating block 65, the second side wall 662 and the fourth side wall 664 further include restriction protrusions 6621, 6641 formed by stamping the second side wall 662 and the fourth side wall 664 inwardly. The restriction protrusions 6621, 6641 are used to mate with the insulating block 65 so as to prevent the insulating block 65 from being drawn out of the metal shell 66.

In the illustrated embodiment of the present disclosure, the metal shell 66 further includes a first extension piece 6611 extending from the first side wall 661 and a pair of first slots 6612 located on opposite sides of the first extension piece 6611. The metal shell 66 further includes a second extension piece 6631 extending from the third side wall 663 and a pair of second slots 6632 located on opposite sides of the second extension piece 6631. The first extension piece 6611 is in vertical contact with the contact portion 621 of the first ground terminal G1 so as to improve the shielding effect. The second extension piece 6631 is in vertical contact with the contact portion 621 of the second ground terminal G2 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same metal shell 66 is greater than a distance between the first side wall 661 and the third side wall 663. Referring to FIG. 21, for a group of conductive terminals 62 arranged in the manner of G1-S1-S1-G2, the contact portion 621 of the first ground terminal G1 includes a first notch 6216 adjacent to the differential signal terminals. The first notch 6216 is used for receiving the first extension piece 6611. The contact portion 621 of the second ground terminal G2 includes a second notch 6217 adjacent to the differential signal terminals. The second notch 6217 is used for receiving the second extension piece 6631. In the illustrated embodiment of the present disclosure, taking two adjacent pairs of differential signal terminals sharing one second ground terminal G2 as an example, two sides of the second ground terminal G2 respectively include second notches 6217 facing different differential signal terminals, and the second notches 6217 are used for mating with two adjacent metal shells 66.

Figure 24:
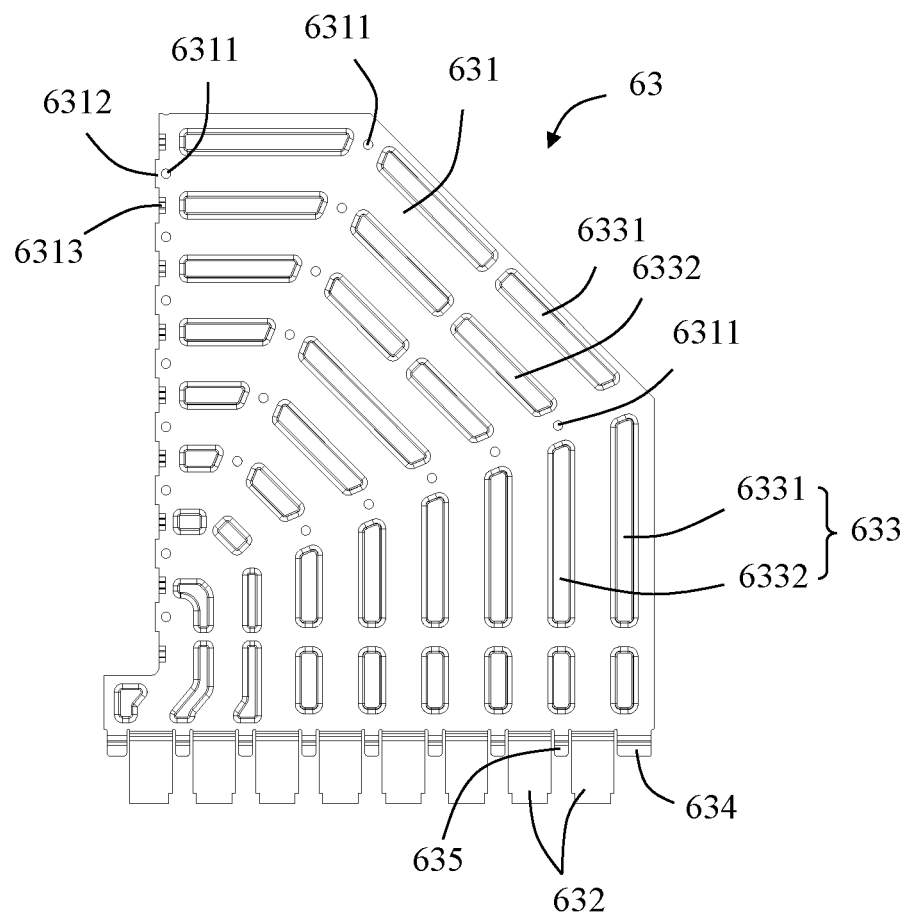
FIG. 24 is a side view of a first metal shield of the second backplane connector.

In the illustrated embodiment of the present disclosure, the first metal shield 63 and the second metal shield 64 are symmetrically disposed on both sides of the insulating frame 61. Referring to FIG. 24, the first metal shield 63 includes a first main body portion 631, a first extension portion 632 extending from the first main body portion 631, and a first elastic arm 634 and a second elastic arm 635 which are respectively located on two sides of the first extension portion 632. The first elastic arm 634 and the second elastic arm 635 extend beyond the first main body portion 631 to contact the first ground terminal G1 and the second ground terminal G2, respectively. The first main body portion 631 is located on one side of the connection portion 623 of the conductive terminal 62. In the illustrated embodiment of the present disclosure, the first extension portion 632 and the first main body portion 631 are located in different planes, in which the first extension portion 632 is farther away from the second metal shield 64 than the first main body portion 631. The first main body portion 631 includes a plurality of first mounting holes 6311 for mating with the plurality of first posts 6161. The first posts 6161 are fixed to the first mounting holes 6311 by soldering. The first main body portion 631 includes a plurality of ribs 633. The ribs 633 include a plurality of first ribs 6331 protruding toward the first ground terminal G1 and a plurality of second ribs 6332 protruding toward the second ground terminal G2. The first ribs 6331 are disposed along an extending direction of the connection portion 623 of the first ground terminal G1. The second ribs 6332 are disposed along an extending direction of the connection portion 623 of the second ground terminal G2. In the illustrated embodiment of the present disclosure, the first ribs 6331 and the second ribs 6332 are formed by stamping the first main body portion 631. The first ribs 6331 and the second ribs 6332 protrude toward the second metal shield 64. The first ribs 6331 and the second ribs 6332 are disposed discontinuously along the extending direction of the connection portion 623 of the first ground terminal G1 and the extending direction of the connection portion 623 of the second ground terminal G2, respectively, so as to achieve multi-position contact. Therefore, the reliability of the contact between the first metal shield 63 and the first ground terminals G1 and the second ground terminals G2 is improved. In the illustrated embodiment of the present disclosure, a wall thickness of the first rib 6331, a wall thickness of the second rib 6332, and a wall thickness of a portion of the first main body portion 631 located between the first rib 6331 and the second rib 6332 are the same.

In addition, the first main body portion 631 further includes a plurality of first protruding pieces 6312 extending downwardly from a bottom edge thereof and a plurality of connecting pieces 6313 each of which is located between two adjacent first protruding pieces 6312. By providing the first protruding pieces 6312, the shielding length can be extended, and the shielding effect on the signal terminals S1 can be improved. In the illustrated embodiment of the present disclosure, the connecting pieces 6313 are stamped from the first main body portion 631. The connecting piece 6313 straddles the corresponding slot 6231 to connect one side of the first end portion 6232 and the second end portion 6233 of the same first ground terminal G1, thereby improving the shielding effect. At the same time, the connecting piece 6313 can also connect one side of the first end portion 6232 and the second end portion 6233 of the same second ground terminal G2, thereby improving the shielding effect.

In the illustrated embodiment of the present disclosure, there are multiple first extension portions 632 which are disposed at intervals. The third extensions 632 are used to be inserted into the first slots 6612 and the second slots 6632 of the metal shell 66 to achieve contact and improve the shielding effect.

Figure 25:
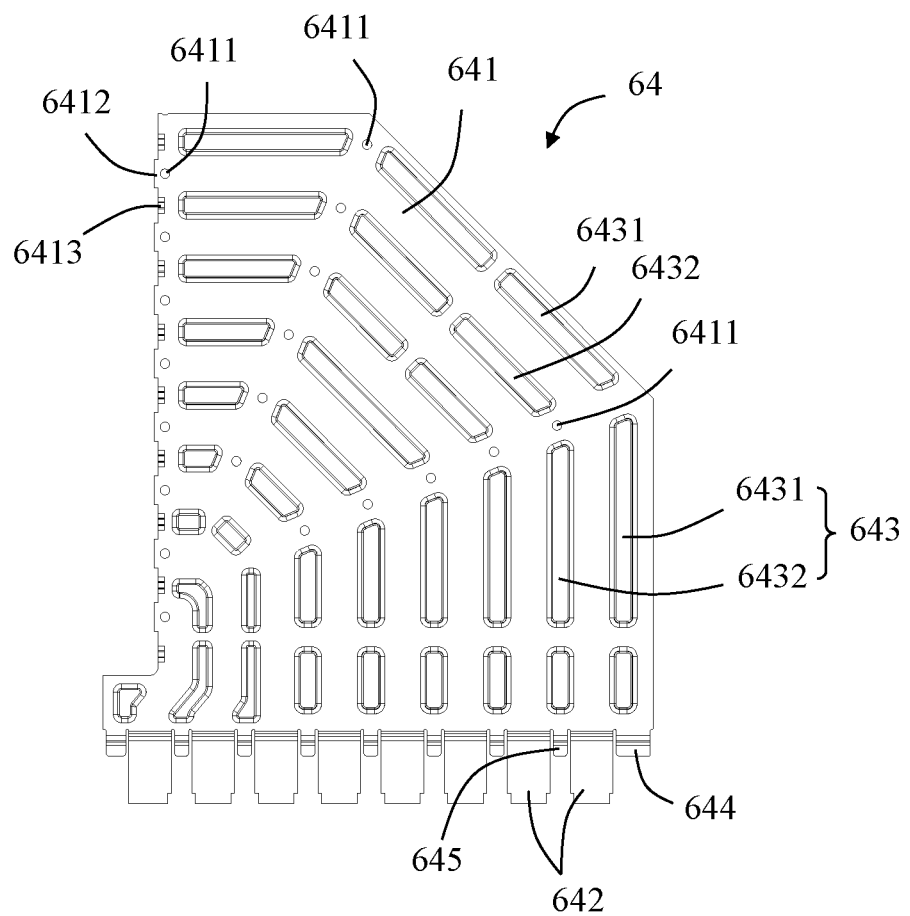
FIG. 25 is a side view of a second metal shield of the second backplane connector.

Similarly, referring to FIG. 25, the second metal shield 64 includes a second main body portion 641, a second extension portion 642 extending from the second main body portion 641, and a third elastic arm 644 and a fourth elastic arm 645 which are respectively located on both sides of the second extension portion 642. The third elastic arm 644 and the fourth elastic arm 645 extend beyond the second main body portion 641 to contact the first ground terminal G1 and the second ground terminal G2, respectively. The second main body portion 641 is located on the other side of the connection portion 623 of the conductive terminal 62. In the illustrated embodiment of the present disclosure, the second extension portion 642 and the second main body portion 641 are located in different planes, in which the second extension portion 642 is farther away from the first metal shield 63 than the second main body portion 641. The second main body portion 641 includes a plurality of second mounting holes 6411 for mating with the plurality of second posts 6162. The second posts 6162 are fixed and positioned in the second mounting holes 6411 by soldering. The second main body portion 641 includes a plurality of ribs 643. The ribs 643 include a plurality of third ribs 6431 protruding toward the first ground terminal G1 and a plurality of fourth ribs 6432 protruding toward the second ground terminal G2. The third ribs 6431 are disposed along the extending direction of the connection portion 623 of the first ground terminal G1. The fourth ribs 6432 are disposed along the extending direction of the connection portion 623 of the second ground terminal G2. In the illustrated embodiment of the present disclosure, the third ribs 6431 and the fourth ribs 6432 are formed by stamping the second main body portion 641. The third ribs 6431 and the fourth ribs 6432 protrude toward the first metal shield 63. The third ribs 6431 and the fourth ribs 6432 are disposed discontinuously along the extending direction of the connection portion 623 of the first ground terminal G1 and the extending direction of the connection portion 623 of the second ground terminal G2, respectively, so as to achieve multi-position contact. Therefore, the contact reliability between the second metal shield 64 and the first ground terminals G1 and the second ground terminals G2 is improved. In the illustrated embodiment of the present disclosure, a wall thickness of the third rib 6431, a wall thickness of the fourth rib 6432, and a wall thickness of a portion of the second main body portion 641 located between the third rib 6431 and the fourth rib 6432 are the same. In an embodiment of the present disclosure, soldering is performed on the surfaces of the ribs 633 and the ribs 643 to solder the ribs 633 and the ribs 643 to the first ground terminals G1 and the second ground terminals G2. For example, soldering is performed on the surfaces of the first ribs 6331, the second ribs 6332, the third ribs 6431 and the fourth ribs 6432 so that the first ribs 6331, the second ribs 6332, the third ribs 6431 and the fourth ribs 6432 are soldered to the first ground terminals G1 and the second ground terminals G2. The soldering method is at least one of spot soldering, laser soldering and ultrasonic soldering.

In addition, the second main body portion 641 further includes a plurality of second protruding pieces 6412 extending downwardly from a bottom edge thereof, and a plurality of connecting pieces 6413 each of which is located between two adjacent second protruding pieces 6412. By providing the second protruding pieces 6412, the shielding length can be extended, and the shielding effect on the signal terminals S1 can be improved. In the illustrated embodiment of the present disclosure, the connecting pieces 6413 is stamped from the second main body portion 641. The connecting piece 6413 straddles the corresponding slot 6231 to connect the first end 6232 and the other side of the second end 6233 of the same first ground terminal G1 so as to improve the shielding effect. At the same time, the connecting piece 6413 can also connect the first end portion 6232 and the other side of the second end portion 6233 of the same second ground terminal G2 so as to improve the shielding effect.

In the illustrated embodiment of the present disclosure, there are multiple second extension portions 642 which are disposed at intervals. The fourth extensions 642 are used to be inserted into the first slots 6612 and the second slots 6632 of the metal shell 66 so as to achieve contact and improve the shielding effect.

Figure 27:
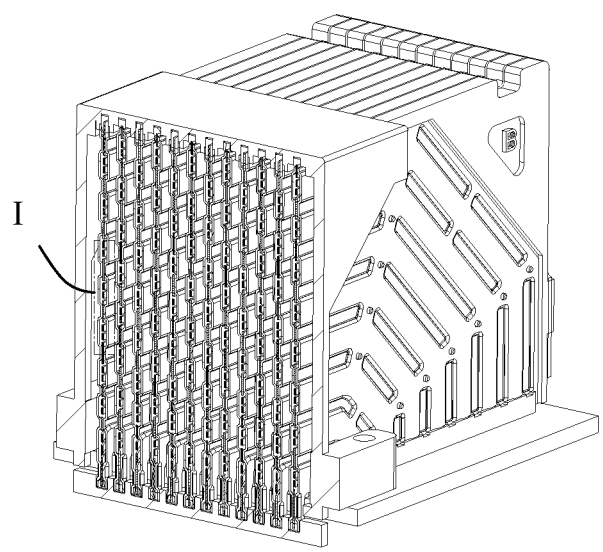
FIG. 27 is a partial perspective cross-sectional view taken along line C'-C' in FIG. 2.
Figure 28:
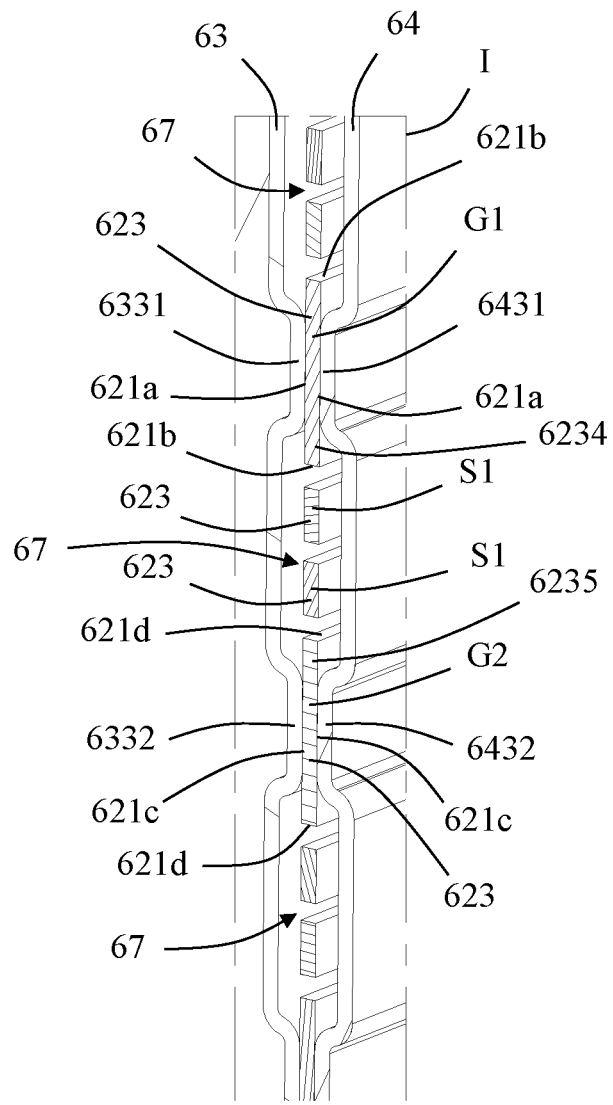
FIG. 28 is a partial enlarged view of a frame part I in FIG. 27.

Referring to FIGS. 27 and 28, in the length of the connection portion 623 of the conductive terminal 62, the first rib 6331 of the first metal shield 63 and the third rib 6431 of the second metal shield 64 are in contact with two opposite side surfaces of the connection portion 623 of the first ground terminal G1, respectively. The second rib 6332 of the first metal shield 63 and the fourth rib 6432 of the second metal shield 64 are in contact with two opposite side surfaces of the connection portion 623 of the second ground terminal G2, respectively. As a result, a shielding cavity 67 surrounding the outer periphery of the connection portion 623 of each pair of differential signal terminals is formed. In the illustrated embodiment of the present disclosure, the first rib 6331 and the third rib 6431 contact the first wide surface 621a of the connection portion 623 of the first ground terminal G1, respectively. The second rib 6332 and the fourth rib 6432 contact the second wide surface 621c of the connection portion 623 of the second ground terminal G2, respectively. In the illustrated embodiment of the present disclosure, the shielding cavity 67 is formed by the first main body portion 631, the second main body portion 641, the first ground terminal G1 and the second ground terminal G2. The connection portion 623 of the first ground terminal G1 includes a third tab portion 6234 extending into the shielding cavity 67. The connection portion 623 of the second ground terminal G2 includes a fourth tab portion 6235 extending into the shielding cavity 67. The connection portions 623 of the differential signal terminals are located between the third tab portion 6234 and the fourth tab portion 6235. In the illustrated embodiment of the present disclosure, there are a plurality of shielding cavities 67 which are disposed along an arrangement direction of each group of the conductive terminals 62. Two adjacent shielding cavities 67 share a single first ground terminal G1 or a single second ground terminal G2. Taking the shared first ground terminal G1 as an example, a part of the shared first ground terminal G1 protrudes into one shielding cavity 67, and another part of the shared first ground terminal G1 protrudes into another shielding cavity 67.

At a position adjacent to the contact portion 621 of the conductive terminal 62, the first extension portion 632 and the second extension portion 642 are both inserted into the first slot 6612 and the second slot 6632 of the metal shell 66. The first extension piece 6611 and the second extension piece 6631 of the metal shell 66 are respectively inserted into the first notch 6216 of the first ground terminal G1 and the second notch 6217 of the second ground terminal G2. At the same time, the first elastic arm 634 of the first metal shield 63 and the third elastic arm 644 of the second metal shield 64 clamp both sides of the contact portion 621 of the first ground terminal G1. The second elastic arm 635 of the first metal shield 63 and the fourth elastic arm 645 of the second metal shield 64 clamp both sides of the contact portion 621 of the second ground terminal G2. Specifically, the first elastic arm 634 and the third elastic arm 644 clamp the first wide surface 621a of the first ground terminal G1. The second elastic arm 635 and the fourth elastic arm 645 clamp the second wide surface 621c of the second ground terminal G2. With this arrangement, the first metal shield 63, the second metal shield 64, the metal shell 66, the first ground terminal G1, and the second ground terminal G2 are all connected in series, thereby the shielding area is increased and the shielding effect is improved.

In the illustrated embodiment of the present disclosure, there are multiple wafers 6 of the second backplane connector 200, and the terminal arrangement of two adjacent wafers 6 are staggered. Correspondingly, the shielding cavities 67 of two adjacent wafers 6 are also staggered. When the wafer 6 is assembled to the header 5, the metal shell 66 of the wafer 6 passes through the corresponding terminal receiving groove 511 so as to extend into the receiving space 535.

Figure 29:
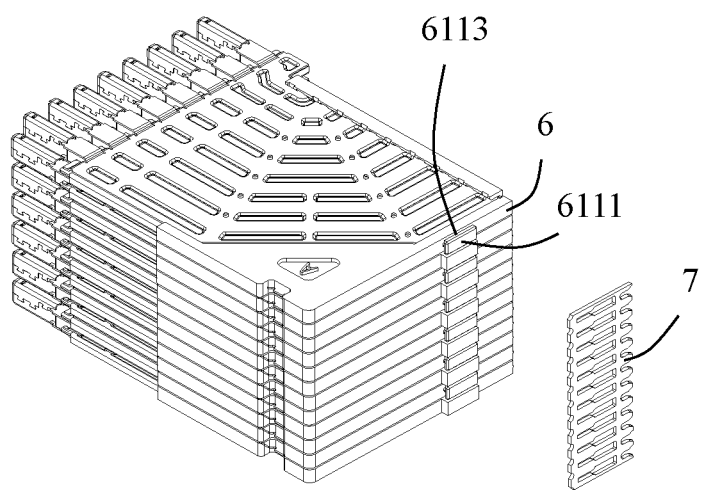
FIG. 29 is a partial perspective exploded view of the second backplane connector, in which a spacer is separated.
Figure 30:
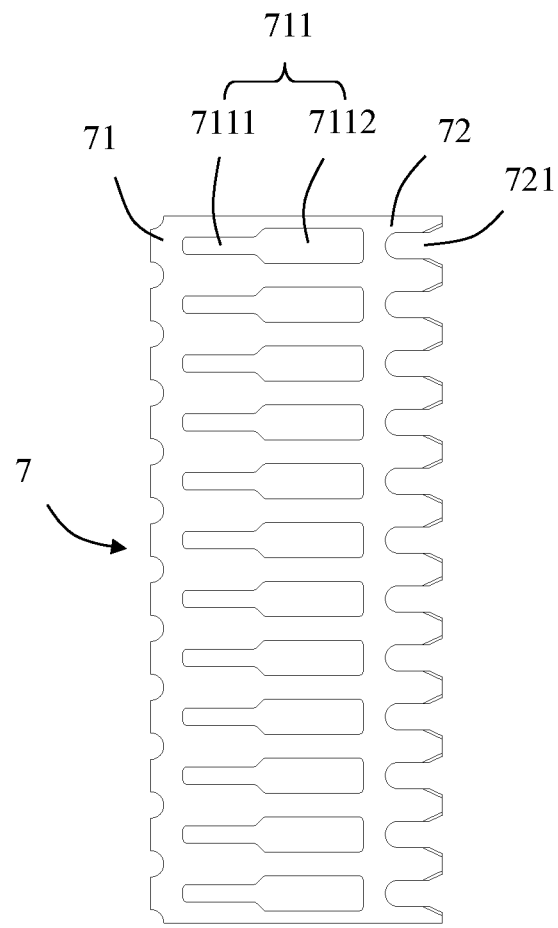
FIG. 30 is a top view of the spacer in FIG. 29.

Referring to FIGS. 29 and 30, in the illustrated embodiment of the present disclosure, the spacer 7 is made of metal material or insulating material. The spacer 7 includes a body portion 71 and a protruding piece 72 extending from the body portion 71. The body portion 71 includes a plurality of slots 711 corresponding to the first protrusions 6111. The protruding piece 72 includes a plurality of slits 721, so that the protruding piece 72 is roughly comb-shaped. Each slot 711 is a closed slot, which means the circumference of the slot 711 is surrounded by the body portion 71. The slit 721 is a non-closed slit, which means one end of the slit 721 is opened. The slit 721 is in alignment with the corresponding slot 711 along the vertical direction. Each slot 711 includes a first slot 7111 and a second slot 7112 of which a width is greater than that of the first slot 7111. The first slot 7111 is located at one side of the second slot 7112 and communicates with the corresponding second slot 7112. The slit 721 is located on the other side of the second slot 7112.

When assembling the spacer 7 to the plurality of wafers 6, firstly, the second slots 7112 of the spacer 7 are corresponding to the first protrusions 6111 along the extending direction of the contact portion 621, and make the first protrusions 6111 pass through the second slots 7112. Then, the spacer 7 is moved along the extending direction of the tail portions 622, so that the first constriction portions 6113 are tightly clamped in the first slots 7111. As a result, all the wafers 6 can be combined into a whole so as to prevent loosening and prevent the wafers 6 from being separated from the spacer 7 along the extending direction of the contact portions 621.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising:
   a plurality of wafers, each wafer comprising an insulating frame and a plurality of conductive terminals fixed to the insulating frame; and
   a spacer assembling the plurality of wafers;
   wherein the insulating frame comprises a first protrusion; and
   wherein the spacer comprises a body portion, and the body portion defines a plurality of slots each of which is adapted to fix corresponding first protrusion.

2. The backplane connector according to claim 1, wherein the first protrusion comprises a first constriction portion, each slot comprises a first slot and a second slot with a width larger than the first slot, the first slot is in communication with the second slot, the second slot is adapted to allow the first protrusion to pass through, and the first constriction portion is clamped in the first slot.

3. The backplane connector according to claim 2, wherein each insulating frame further comprises a second protrusion separated from the first bump, the second protrusion comprises a second constriction portion, the spacer comprises a protruding piece extending from the body portion, the protruding piece defines a plurality of slits in which the second constriction portion are clamped.

4. The backplane connector according to claim 3, wherein the first protrusion is in alignment with the second protrusion, and the slit is in alignment with the slot.

5. The backplane connector according to claim 1, wherein the insulating frame is frame-shaped, and the insulating frame comprises a front wall adjacent to the contact portions of the conductive terminals, a bottom wall adjacent to the tail portions of the conductive terminals, a rear wall opposite to the front wall, and a top wall opposite to the bottom wall; and wherein the first protrusion is provided on the rear wall.

6. The backplane connector according to claim 1, wherein each conductive terminal comprises a contact portion, a tail portion and a connection portion connecting the contact portion and the tail portion, the insulating frame is fixed with the connection portions of the conductive terminals, and the contact portions and the tail portions extend beyond the insulating frame;
   wherein the backplane connector further comprises a first metal shield located on one side of the insulating frame and a second metal shield located on the other side of the insulating frame;
   wherein the conductive terminals comprise differential signal terminals, a first ground terminal and a second ground terminal, and the differential signal terminals are located between the first ground terminal and the second ground terminal; and
   wherein the insulating frame comprises a hollow portion, the connection portions of the differential signal terminals, the connection portion of the first ground terminal and the connection portion of the second ground terminal are coplanar and partially exposed to the hollow portion.

7. The backplane connector according to claim 1, wherein the first metal shield comprises a first main body portion, the first main body portion comprises a first rib protruding toward the first ground terminal and a second rib protruding toward the second ground terminal;
   wherein the second metal shield comprises a second main body portion, the second main body portion comprises a third rib protruding toward the first ground terminal and a fourth rib protruding toward the second ground terminal; and
   wherein the first rib and the third rib are in contact with opposite side surfaces of the connection portion of the first ground terminal, respectively; the second rib and the fourth rib are in contact with opposite side surfaces of the connection portion of the second ground terminal, respectively; and the first main body portion, the second main body portion, the first ground terminal and the second ground terminal jointly form a shielding cavity enclosing the connection portions of the differential signal terminals.

8. The backplane connector according to claim 7, wherein the connection portion of the first ground terminal comprises a first tab portion protruding into the shielding cavity, the connection portion of the second ground terminal comprises a second tab portion protruding into the shielding cavity, and the connection portions of the differential signal terminals are located between the first tab portion and the second tab portion.

9. The backplane connector according to claim 7, wherein the first metal shield comprises a first extension portion located on one side of the contact portions of the conductive terminals, the first extension portion comprises a first bulge protruding toward the first ground terminal and a second bulge protruding toward the second ground terminal;
   wherein the second metal shield comprises a second extension portion located on the other side of the contact portions of the conductive terminals, the second extension portion comprises a third bulge protruding toward the first ground terminal and a fourth bulge protruding toward the second ground terminal; and
   wherein the first bulge and the third bulge are in contact with opposite side surfaces of the contact portion of the first ground terminal, respectively; the second bulge and the fourth bulge are in contact with opposite side surfaces of the contact portion of the second ground terminal, respectively; and the first extension portion, the second extension portion, the first ground terminal and the second ground terminal jointly form a shielding space enclosing the contact portions of the differential signal terminals.

10. The backplane connector according to claim 7, wherein the wafer comprises an insulating block sleeved on the contact portions of the differential signal terminals, and a metal shell sleeved on the insulating block; and wherein the metal shell is in contact with the first metal shield and the second metal shield.

* * * * *